(12) United States Patent
Djrbashian et al.

(10) Patent No.: US 12,328,852 B2
(45) Date of Patent: Jun. 10, 2025

(54) CONTACTOR APPARATUS

(71) Applicant: Rivian IP Holdings, LLC, Irvine, CA (US)

(72) Inventors: Edward Djrbashian, Glendale, CA (US); Brandon Thayer, Aliso Viejo, CA (US); Jonathan Wilson, San Jose, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 658 days.

(21) Appl. No.: 17/739,647

(22) Filed: May 9, 2022

(65) Prior Publication Data

US 2023/0363119 A1 Nov. 9, 2023

(51) Int. Cl.
*H05K 7/20* (2006.01)
*H01M 50/249* (2021.01)
*H02G 5/02* (2006.01)

(52) U.S. Cl.
CPC ...... *H05K 7/20854* (2013.01); *H01M 50/249* (2021.01); *H02G 5/02* (2013.01); *H01M 2220/20* (2013.01)

(58) Field of Classification Search
CPC ............ H01M 50/249; H01M 2220/20; H05K 7/20854; H02G 5/02
See application file for complete search history.

(56) References Cited

U.S. PATENT DOCUMENTS

2021/0313132 A1* 10/2021 Del Giudice .......... H01H 50/12

* cited by examiner

*Primary Examiner* — Sarah A. Slifka
(74) *Attorney, Agent, or Firm* — Foley & Lardner LLP

(57) ABSTRACT

An apparatus can include a housing, a first contactor portion, a heat sink, and a second contactor portion. The first contactor portion can be coupled with the housing. The heat sink can be coupled with the housing. The second contactor portion can contact the first contactor portion in a first position. The second contact or portion can thermally couple with a heatsink in a second position.

20 Claims, 10 Drawing Sheets

CONTACTOR APPARATUS

INTRODUCTION

Vehicles can use electricity to power a motor. Electricity can be provided by a battery.

SUMMARY

A contactor apparatus for electrical applications can include a heat sink coupled with a housing of the contactor to regulate or remove heat from the contactor apparatus. The contactor apparatus can include a housing, a fixed contactor, and a moveable contactor that selectively contacts the fixed contactor. The contactor apparatus can allow an electrical current to flow through the contactor when the moveable contactor is in a closed position where the moveable contactor contacts the fixed contactor. The heat sink can thermally couple with the moveable contactor when the moveable contactor is in an open position. The heat sink can remove heat from the moveable contactor.

At least one aspect is directed to an apparatus. The apparatus can include a housing, a first contactor portion, a heat sink, and a second contactor portion. The first contactor portion can be coupled with the housing. The heat sink can be coupled with the housing. The second contactor portion can contact the first contactor element in a first position. The second contactor portion can thermally couple with a heatsink in a second position.

At least one aspect is directed to a system. The system can include a contactor, a first busbar, and a second busbar. The contactor can include a housing, a first contactor portion coupled with the housing, a heat sink coupled with the housing, and a second contactor portion. The first contactor portion can include a first contactor element and a second contactor element. The first contactor element can be coupled with the first busbar. The second contactor element can be coupled with the second busbar. The second contactor portion can contact the first contactor portion in a first position. The second contactor portion can thermally couple with the heat sink in a second position.

At least one aspect is directed to an electric vehicle. The electric vehicle can include a battery pack electrically coupled with at least one of a first busbar and a second busbar and a contactor. The contactor can include a housing, a first contactor portion coupled with the housing, a heat sink coupled with the housing, and a second contactor portion. The first contactor portion can include a first contactor element coupled with the first busbar and a second contactor element coupled with the second busbar. The second contactor portion can contact the first contactor portion in a first position. The second contact portion can thermally couple with the heat sink in a second position.

At least one aspect is directed to an apparatus. The apparatus can include a housing, a first contactor, a heat sink, and a second contactor. The first contactor can be coupled with the housing. The heat sink can be coupled with the housing. The second contactor can contact the first contactor. The second contactor can thermally couple with a heatsink.

At least one aspect is directed to a method of manufacturing a contactor. The method can include providing a housing, coupling a first contactor portion with the housing, and coupling a heat sink with the housing. The method can also include providing a second contactor portion that contacts the first contactor portion in a first position and that thermally couples to the heat sink in a second position.

At least one aspect is directed to a method of manufacturing an electrical system. The method can include coupling a first contactor portion of a contactor with a housing, the first contactor portion comprising a first contactor element and a second contactor element. The method can also include coupling a heat sink with the housing and providing a second contactor portion that contacts the first contactor portion in a first position and that thermally couples to the heat sink in a second position. The method can also include coupling a first busbar with the first contactor element and coupling a second busbar with the second contactor element. The first busbar, the first contactor portion, the second contactor portion, and the second busbar can receive an electrical current with the second contactor portion in the first position.

At least one aspect is directed to a method. The method can include providing a contactor, the contactor comprising a housing, a first contactor portion coupled with the housing and a heat sink coupled with the housing. The contactor can also include a second contactor portion that contacts the first contactor portion in a first position and that thermally couples to the heat sink in a second position.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. The foregoing information and the following detailed description and drawings include illustrative examples and should not be considered as limiting.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Following below are more detailed descriptions of various concepts related to, and implementations of, methods, apparatuses, and systems of a contactor. The various concepts introduced above and discussed in greater detail below may be implemented in any of numerous ways.

The present disclosure is generally related to a contactor apparatus with a heat sink and related systems and methods. More specifically, the disclosure is directed to a contactor apparatus for electrical applications that includes heat sink coupled with a housing of the contactor that can remove heat from the contactor when the contactor is in an open position. The contactor apparatus can include a housing, a fixed portion, and a moveable portion that selectively contacts the fixed portion. The contactor apparatus can allow current to flow through the contactor when the moveable portion is in a closed position where the moveable portion contacts the fixed portion. As current flows through the contactor, heat can be generated in or around the contactor. The contactor apparatus can be in an open position and can prevent current from flowing through the contactor when the moveable portion is in an open position where the moveable portion is spaced apart from the fixed portion. With the moveable portion in the closed position, heat can be at least partially removed using various cooling methods, such as a cold plate, fan, or other element that is thermally coupled with the fixed portion.

It can be difficult to remove heat from the contactor apparatus with the moveable portion of the contactor in the open position. With the contactor in an open position, the moveable portion can be separated from the fixed portion, thereby creating an air-gap between the fixed portion and the moveable portion that can limit or prevent heat dissipation via the cold plate, fan, or other element. Therefore, remaining heat in the moveable portion cannot be dissipated effectively.

The disclosed solutions have a technical advantage of facilitating the removal of heat from the contactor when the moveable contactor is in the open position. For example, the contactor apparatus can include a heat sink that can thermally couple with the moveable portion when the moveable portion is in the open position. The heat sink can be coupled with or integrated with the housing of the contactor apparatus. The heat sink can facilitate a transfer of heat from the moveable portion to surrounding components, such as an aluminum casting that houses the contactor and related components, other thermally conductive materials, for example.

Figure 1:
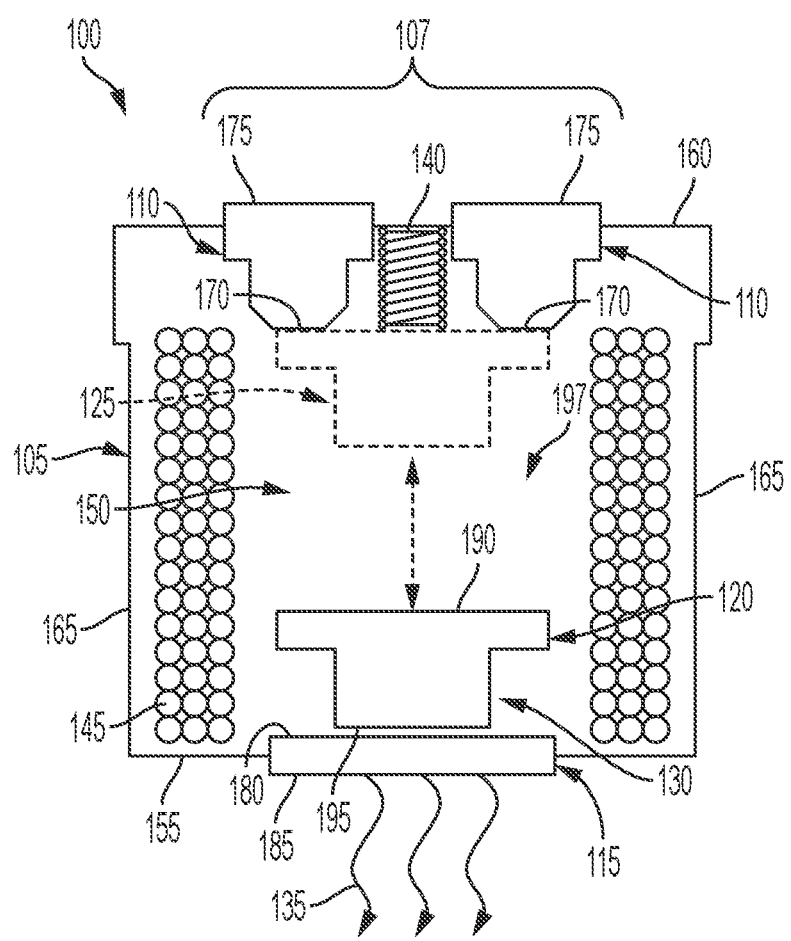
FIG. 1 depicts an example contactor apparatus, in accordance with some aspects.

FIG. 1 depicts an apparatus 100. The apparatus 100 could be a contactor 100. The contactor 100 can be an electrical contactor that selectively allows an electrical current to flow between two busbars. For example, the contactor 100 can be used with an electric vehicle to selectively allow an electrical current to flow to a battery from a charging port, to an electric motor from a battery, or to an outlet port from a battery, or otherwise. A plurality of contactors 100 can be used to selectively allow current to flow between various components of an electric vehicle. Multiple contactors 100 can be used simultaneously. The contactor 100 can allow current to flow in multiple directions, such as from a battery to an electrical port and from the electrical port to the battery.

The contactor 100 can include at least one housing 105. For example, the contactor 100 can include the housing 105 that defines an interior cavity 150. The housing 105 can comprise a plastic, composite, or other non-metallic material. The housing 105 can include a bottom portion 155, a top portion 160, and at least one sidewall portion 165. The bottom portion 155, top portion 160, and sidewall portion 165 can have substantially the same wall thickness (e.g., ±20%). The wall thickness can be between one millimeter and five millimeters, according to one example. The wall thickness can be greater (1 cm, 2 cm, etc.). The housing 105 can have a generally rectangular shape, cylindrical shape, elliptical shape, or otherwise. The housing 105 be a unitary structure where each of the bottom portion 155, top portion 160, and sidewall portion 165 are integrally formed. The housing 105 can be assembled from multiple components. For example, the bottom portion 155 can be coupled with the sidewall portion 165.

The contactor 100 can include at least one first contactor portion 107 coupled with the housing 105. For example, the first contactor portion 107 can be a metallic member coupled with the top portion 160 of the housing 105. The first contactor portion 107 can include at least one contactor element 110. The contactor element can 110 can be coupled with the top portion 160 of the housing 105 and can extend into the cavity 150 of the housing 105, according to one example. The contactor element 110 can include a bottom portion 170 and a top portion 175. The bottom portion 170 can extend into the cavity of the housing 105. The top portion 175 can extend from the top portion 160 and outside of the cavity 150 of the housing 105. The contactor element 110 can couple with a busbar. For example, a busbar can be coupled with the contactor element 110 proximate the top portion 160 of the housing 105 outside of the cavity 150 of the housing 105. The contactor element 110 can be or include a fastener that can couple with the busbar, according to one example. The contactor element 110 can conduct current (e.g., allow an electrical current to flow through at least a portion of the contactor element 110). The contactor element 110 can allow current to flow from the top portion 175 to the bottom portion 170, from the bottom portion 170 to the top portion 175, or otherwise.

The contactor 100 can include at least one heat sink 115 coupled with the housing 105. For example, the heat sink 115 can be coupled with the bottom portion 155 of the housing 105. The heat sink 115 can be a thermally conductive material. The heat sink 115 can comprise a metallic or non-metallic material. For example, the heat sink 115 can comprise a ceramic material, a silicon material, a plastic material, a composite material, a ferrous metallic material, a non-ferrous metallic material, or otherwise. The heat sink 115 can include a plurality of materials, including a combination of multiple non-metallic materials, a combination of metallic materials, or a combination of non-metallic and metallic materials.

The heat sink 115 can include a top portion 180 and a bottom portion 185. For example, the top portion 180 of the heat sink 115 can extend into the cavity 150 of the housing 105. The bottom portion 185 can extend from the bottom portion 155 of the housing 105 outside of the cavity 150. The heat sink 115 can thus at least partially extend into the cavity 150 and outside of the housing 105, according to one example. The heat sink 115 can be single thermally conductive component or can be a plurality interconnected or disconnected thermally conductive components. For example, the heat sink 115 can be a thermally conductive disc coupled with the bottom of the housing 105. The top portion 180 of the heat sink 115 can be a substantially flat (e.g., ±20° from horizontal) surface while the bottom portion 185 can be textured or otherwise non-flat. For example, the bottom portion 185 of the heat sink 115 can include a plurality of fins (e.g., slender projections) to facilitate the dissipation of heat via the heat sink 115. The heat sink 115 can include multiple thermally conductive materials, such as a first material proximate the top portion 180 and a second material proximate the bottom portion 185.

The heat sink 115 can absorb or transfer heat from objects that are thermally coupled with the heat sink 115. For example, the heat sink 115 can be thermally coupled with an object having an elevated temperature relative to the heat sink 115. The heat sink 115 can passively absorb heat from the object having an elevated temperature to draw the heat away from the object. In this way, the heat sink 115 can remove heat from an object. The top portion 180 of the heat sink 115 can thermally couple with an object having an elevated temperature. The heat sink 115 can then transfer heat from the top portion 180 to the bottom portion 185, thereby transferring heat away from the cavity 150 of the housing 105 and to an exterior environment. The heat sink 115 can thermally couple with an object via direct contact when an object abuts (e.g., contacts, touches) the top portion 180 of the heat sink 115. The heat sink 115 can thermally couple with an object even when the object does not abut the heat sink 115. For example, the heat sink 115 can thermally couple with an object that is spaced apart from the top portion 180 of the heat sink 115.

The contactor 100 can include at least one second contactor portion 120. The second contactor portion 120 can move between a first position 125 and a second position 130. For example, the second contactor portion 120 can comprise a ferrous metallic material that can conduct electric current (e.g., can allow current to flow through the second contactor portion 120). The second contactor portion 120 can be magnetically attracted to other components, according to one example. The second contactor portion 120 can be moved by an electromagnetic field. The second contactor portion 120 can include a plurality of materials, including at least one ferrous metallic material that can conduct electrical current. The second contactor portion 120 can be positioned within the cavity 150 of the housing 105. The second contactor portion 120 can move between the first position 125 and the second position 130 within the cavity 150 of the housing. The second contactor portion can include a top portion 190 and a bottom portion 195.

The first position 125 can be proximate the first contactor portion 107 and contactor element 110. For example, the first position 125 can include the top portion 190 of the second contactor portion 120 contacting (e.g., abutting, touching) the bottom portion 170 of the contactor element 110. The first position 125 can be proximate the top portion 160 of the housing 105. The second position 130 can be proximate the heat sink 115. For example, the second position 130 can include the bottom portion 195 of the second contactor portion 120 contacting (e.g., abutting, touching) the top portion 180 of the heat sink 115. The second position 130 can be proximate the bottom portion 155 of the housing 105. The first position 125 or the second position 130 can be anywhere within the housing 105. For example, the first position 125 can be proximate the sidewall portion 165. The second position 130 can be proximate the sidewall portion 165. Both the first position 125 and the second position 130 can be proximate the top portion 160, the bottom portion 155, or the sidewall portion 165 of the housing 105. The first position 125 could be in a center of the housing 105 (e.g., approximately equidistant from the top portion 160 and the bottom portion 155 or approximately equidistant from opposing sides of the sidewall portion 165). The second position 130 could be in the center of the housing 105 (e.g., approximately equidistant from the top portion 160 and the bottom portion 155 or approximately equidistant from opposing sides of the sidewall portion 165).

The first position 125 and the second position 130 can be at any position between the bottom portion 155, top portion 160, or the sidewall portion 165. The first position 125 and the second position 130 can be the same or a different position.

The contactor 100 can include the second contactor portion 120 that can contact the first contactor portion 107. For example, the second contactor portion 120 can contact the first contactor portion 107 with the second contactor portion 120 in the first position 125. The top portion 190 of the second contactor portion 120 can contact (e.g., abut, touch, mate with) the bottom portion 170 of the contactor element 110. The second contactor portion 120 can contact the contactor element 110 such that an electrical current can pass from the contactor element 110 to the second contactor portion 120 or from the second contactor portion 120 the contactor element 110. In one example, the second contactor portion 120 can contact a plurality of contactor elements 110 (e.g., two, three, or four) simultaneously when in the first position 125. For example, an electrical current can pass from a first contactor element 110 to the second contactor portion 120 and then from the second contactor portion 120 to a second contactor element 110. In one example, the top portion 190 of the second contactor portion 120 can mate with the bottom portion 170 of the contactor element 110 such that the surface area of the second contactor portion 120 and the contactor element 110 that is respectively in contact with the contactor element 110 or second contactor portion 120 is maximized. For example, the bottom portion 170 of the contactor element 110 can be a flat surface. The top portion 190 of the second contactor portion 120 can be a flat surface that is substantially parallel (e.g., within ±10° from parallel) with the bottom portion 170. The top portion 190 of the second contactor portion 120 can define at least one cavity (e.g., aperture, impression, hole) that can receive a portion of the contactor element 110 when the second contactor portion 120 is in the first position 125.

The contactor 100 can allow an electrical current to flow through the first contactor portion 107 and the second contactor portion 120 with the second contactor portion 120 in the first position 125. For example, the second contactor portion 120 can contact (e.g., abut, touch, mate with) the first contactor portion 107 when the second contactor portion 120 is in the first position. The first contactor portion 107 and the second contactor portion 120 can be coupled such that an electrical current can flow from the first contactor portion 107 to the second contactor portion 120 or from the second contactor portion 120 to the first contactor portion 107. For example, both the first contactor portion 107 and the second contactor portion 120 can comprise an electrically conductive material (e.g., a metallic material). When the first contactor portion 107 and the second contactor portion 120 are coupled, a current introduced to the first contactor portion 107 can flow to the second contactor portion 120. When the first contactor portion 107 and the second contactor portion 120 are coupled, a current introduced to the second contactor portion 120 can flow to the first contactor portion 107. The second contactor portion 120 can electrically couple with one or more contactor elements 110 of the first contactor portion 107. For example, an electrically current can flow form a first contactor element 110, through the second contactor portion 120, and through a second contactor element 110. Current cannot flow from the first contactor element 110 to the second contactor element 110 when the second contactor portion 120 is not in the first position 125 (e.g., when the second contactor portion 120 is not electrically coupled with the first contactor portion 107).

The contactor 100 can include the second contactor portion 120 that can thermally couple with the heat sink 115. For example, the second contactor portion 120 can thermally couple with the heat sink 115 with the second contactor portion 120 in the second position 130. For example, the bottom portion 195 of the second contactor portion 120 can contact (e.g., abut, touch, mate with) with the top portion 180 of the heat sink 115 when the second contactor portion 120 is in the second position 130. Some other material (the bottom portion 155 of the housing 105) can be disposed between the second contactor portion 120 and the heat sink 115 such that the bottom portion 195 can contact the bottom portion 155 of the housing 105 when the contactor portion 120 is in the second position while the bottom portion 155 of the housing 105 is coupled with the top portion 180 of the heat sink 115. The bottom portion 195 of the second contactor portion 120 can be spaced apart from the top portion 180 of the heat sink 115. A distance between the top portion 180 of the heat sink 115 and the bottom portion 195 of the second contactor portion 120 can be less than one millimeter, between one millimeter and one centimeter, or greater than one centimeter, according to one example. The second contactor portion 120 can be positioned relative to the heat sink 115 such that the heat sink 115 can absorb or remove heat 135 from the second contactor portion 120 with the second contactor portion 120 in the second position 130.

The contactor 100 can include the heat sink 115 to remove heat from the second contactor portion 120 with the second contactor portion 120 in the second position 130. For example, the heat sink 115 can thermally couple with the second contactor portion 120 with the second contactor portion 120 in the second position 130 to remove heat 135 from the second contactor portion 120. For example, the second contactor portion 120 may become hot (e.g., experience a rise in temperature) when in the first position 125 as current flows through the second contactor portion 120. Substantially every time (e.g., 90-100% of the time) the second contactor portion 120 is in the first position 125, the second contactor portion is conducting electrical current and can experience an elevated temperature. When the second contactor portion 120 moves from the first position 125 to the second position 130, the second contactor portion 120 can still be at an elevated temperature. For example, the second contactor portion 120 can have a temperature that is approximately 50-250° F. hotter than surrounding components (e.g., the heat sink 115). The second contactor portion 120 can have a temperature that is 212° F. (100° C.) hotter than surrounding components.

A temperature differential can exist between the heat sink 115 and the second contactor portion 120 when the second contactor portion 120 moves from the first position 125 to the second position 130. The heat sink 115 can have a lower temperature than the second contactor portion 120 in some scenarios. The heat sink 115 can absorb heat from the second contactor portion 120 with the second contactor portion 120 in the second position 130. The heat sink 115 can absorb heat from the second contactor portion 120 to reduce the temperature of the second contactor portion 120. The heat sink 115 can draw heat away from the second contactor portion 120. For example, the heat sink 115 can transfer heat from the top portion 180 of the heat sink 115 that is absorbed from the bottom portion 195 of the second contactor portion 120 and transfer the heat to the bottom portion 185 of the heat sink 115. A temperature of the second contactor portion 120 can be reduced with the second contactor portion 120 while in the second position 130 and thermally coupled to the heat sink 115.

The contactor 100 can include a spring 140 and a winding 145 positioned within the housing 105. For example, the winding 145 can include a copper wire that is wound around the second contactor portion 120. The winding 145 can define an opening 197. The second contactor portion 120 can move between the first positon 125 and the second position 130 within the opening 197. In one example, a portion of the second contactor portion 120 can move between the first position 125 and the second position 130 within the opening 197. The bottom portion 170 of the contactor element 110 can extend into the opening 197. For example, the first position 125 of the second contactor portion 120 can be substantially within the opening 197 such that the contactor element 110 and the second contactor portion 120 are in contact within the opening 197. The top portion 180 of the heat sink 115 can be within the opening 197, according to one example.

The spring 140 can be a wound, elastic, metallic member that is positioned proximate the top portion 160 of the housing 105. For example, the spring 140 can be positioned between two contactor elements 110. The spring 140 can be positioned against the top portion 160 of the housing 105. The spring 140 can compress and extend in a direction perpendicular to the top portion 160 of the housing 105. When compressed, the spring 140 can store potential energy that can be exerted in a direction perpendicular to the top portion 160 and towards the bottom portion 155. In one example, the spring 140 can exert a spring force on the top portion 190 of the second contactor portion 120 with the second contactor portion 120 in the first position 125. The spring force exerted by the spring 140 on the top portion 190 of the second contactor portion 120 can be less than an opposing force exerted on the second contactor portion 120 by an electromagnetic field created by the winding 145, according to one example.

The spring 140 can be positioned proximate the bottom portion 155 of the housing 105. For example, the spring 140 can be positioned against the top portion 180 of the heat sink 115 that is coupled with the bottom portion 155 of the housing 105. The spring 140 can compress and extend in a direction perpendicular to the bottom portion 155 of the housing 105. When compressed, the spring 140 can store potential energy that can be exerted in a direction perpendicular to the bottom portion 155 and towards the top portion 160 of the housing 105. In one example, the spring 140 can exert a spring force on the bottom portion 195 of the second contactor portion 120 with the second contactor portion 120 in the second position 130. The spring force exerted by the spring 140 on the bottom portion 195 of the second contactor portion 120 can be less than an opposing force exerted on the second contactor portion 120 by an electromagnetic field created by the winding 145, according to one example.

The contactor 100 can include the winding 145 to create an electromagnetic field to cause the second contactor portion 120 to move from the second position 130 to the first position 125. The winding 145 can create an electromagnetic field that causes the second contactor portion 120 to move in a direction that opposes a direction of the spring force created by the spring 140. The winding 145 can conduct an electrical current. In one example, a control system or computer system can selectively provide an electrical current to the winding 145. For example, a computer system of an electric vehicle can provide current to the winding 145 in response to a command, a control signal, or some other condition. A battery management system of an electric vehicle can provide current to the contactor 100 to cause the second contactor portion 120 to move from the second position 130 to the first position 125 in order to energize (e.g., provide current to) a busbar or other electrical conduit to power the electric vehicle or to charge a battery of the electric vehicle, for example. The winding 145 can generate an electromagnetic field with the winding 145 conducting an electrical current. The electromagnetic field generated by the winding 145 can cause the second contactor portion 120 to move from the second position 130 to the first position 125. In one example, the electromagnetic field generated by the winding 145 can cause the second contactor portion 120 to contact (e.g., abut, touch, mate with) the bottom portion 170 of the contactor element 110. The electromagnetic field can exert a force acting perpendicular to the top portion 160 of the housing in a direction towards the top portion 160. The force generated by the electromagnetic field can cause top portion 190 of the second contactor portion 120 can remain in contact with the bottom portion 170 of the contactor element 110 despite the spring force acting in an opposite direction. A current can pass through both the contactor element 110 and the second contactor portion 120 with the winding 145 creating a force to hold the second contactor portion 120 in the first position 125.

The contactor 100 can include the spring 140 to cause the second contactor portion 120 to move from the first position 125 to the second position 130 in absence of the electromagnetic field. For example, when the electromagnetic field generated by the winding 145 is acting, the spring 140 can be compressed between a top portion 190 of the second contactor portion 120 and the top portion 160 of the housing 105. The electromagnetic field generated by the winding 145 can create a force that opposes the spring force created by the spring 140. The spring force can be insufficient to overcome the force acting on the second contactor portion 120 via the electromagnetic field. The spring 140 can store potential energy with the spring 140 compressed between the top portion 190 of the second contactor portion 120 and the top portion 160 of the housing 105. When the winding 145 is not electrically charged, the electromagnetic field is not created. Without the electromagnetic field, the spring force stored as potential energy in the spring 140 is at least partially unopposed. The spring force can act on the top portion 190 of the second contactor portion 120 to move the second contactor portion 120 in a direction perpendicular to the top portion 160 of the housing 105 in a direction away from the top portion 160. The spring force can act to move the second contactor portion 120 from the first position 125 to the second position 130. For example, the spring force of the spring 140 can cause the second contactor portion 120 to contact (e.g., abut, touch, mate with) the heat sink 115.

The contactor 100 can include the winding 145 to create an electromagnetic field to cause the second contactor portion 120 to move from the first position 125 to the second position 130. For example, the winding 145 can create an electromagnetic field that causes the second contactor portion 120 to contact (e.g., abut, touch, mate with) the heat sink 115. The winding 145 can create an electromagnetic field that causes the second contactor portion 120 to move in a direction that opposes a direction of the spring force created by the spring 140. For example, the winding 145 can create an electromagnetic field that causes the second contactor portion 120 to move towards the bottom portion 155 of the housing, where the spring 140 is positioned proximate to and extends perpendicularly from the bottom portion 155. The winding 145 can conduct an electrical current. The winding 145 can generate an electromagnetic field with the winding 145 conducting an electrical current. The electromagnetic field generated by the winding 145 can cause the second contactor portion 120 to move from the first position 125 to the second position 130. In one example, the electromagnetic field generated by the winding 145 can cause the second contactor portion 120 to contact (e.g., abut, touch, mate with) the top portion 180 of the heat sink 115. The electromagnetic field can cause the second contactor portion 120 to thermally couple with the heat sink 115. The electromagnetic field can exert a force acting perpendicular to the bottom portion 155 of the housing 105 in a direction towards the bottom portion 155. The force generated by the electromagnetic field can cause bottom portion 195 of the second contactor portion 120 can remain in contact with the top portion 180 of the 115 or remain thermally coupled with the heat sink 115 despite the spring force acting in an opposite direction. The heat sink 115 can remove heat 135 from the second contactor portion 120 with the winding 145 creating a force to hold the second contactor portion 120 in the second position 130.

The contactor 100 can include the spring 140 to cause the second contactor portion 120 to move from the second position 130 to the first position 125 in absence of the electromagnetic field. For example, when the electromagnetic field generated by the winding 145 is acting, the spring 140 can be compressed between the bottom portion 195 of the second contactor portion 120 and the top portion 180 of the heat sink 115. The electromagnetic field generated by the winding 145 can create a force that opposes the spring force created by the spring 140. The spring force can be insufficient to overcome the force acting on the second contactor portion 120 via the electromagnetic field. The spring 140 can store potential energy with the spring 140 compressed between the top portion 180 of heat sink 115 and the bottom portion 195 of the second contactor portion 120. When the winding 145 is not electrically charged, the electromagnetic field is not created. Without the electromagnetic field, the spring force stored as potential energy in the spring 140 is at least partially unopposed. The spring force can act on the bottom portion 195 of the second contactor portion 120 to move the second contactor portion 120 in a direction perpendicular to the bottom portion 155 of the housing 105 in a direction away from the bottom portion 155. The spring force can act to move the second contactor portion 120 from the second position 130 to the first position 125.

The contactor 100 can include the heat sink 115 to thermally couple with the winding 145. For example, the winding 145 can be positioned within the cavity 150 of the housing 105. At least a portion of the winding 145 can be positioned proximate the bottom portion 155 of the housing 105. At least a portion of the winding 145 can be positioned proximate the sidewall portion 165 of the housing 105. A temperature of the winding 145 can increase as the winding 145 conducts electrical current to create an electromagnetic field. The temperature of the winding 145 can increase as the winding 145 passively absorbs heat from the first contactor portion 107 or the second contactor portion 120 with the second contactor portion 120 in the first position 125. The temperature of the winding 145 can be higher than a temperature of the heat sink 115 in some circumstances. The heat sink 115 can thermally couple with at least a portion of the winding 145 to remove heat from the winding 145. The heat sink 115 can contact (e.g., abut, touch, mate with) a portion of the winding 145. The heat sink 115 can be spaced apart from the winding 145 at a distance where the heat sink 115 can still thermally couple with the winding 145 to remove heat from the winding 145.

The contactor 100 can include a second heat sink 115 coupled with the housing 105. For example, the second heat sink 115 can remove heat 135 from the second contactor portion 120 with the second contactor portion 120 in the second position 130. The second heat sink 115 can be positioned proximate the bottom portion 155 of the housing 105. The second heat sink 115 can be positioned proximate the sidewall portion 165 of the housing 105. The second heat sink 115 can be coupled with the bottom portion 155 of the housing. The second heat sink 115 can be coupled with the sidewall portion 165 of the housing 105. The second heat sink 115 can passively absorb heat from the second contactor portion 120 with the second contactor portion 120 in the second position 130. For example, second contactor portion 120 can have an elevated temperature when the second contactor portion 120 moves from the first position 125 (e.g., where an electrical current can pass through the second contactor portion 120) to the second position 130. In such circumstances, the second contactor portion 120 can have a higher temperature than the second heat sink 115. The second contactor portion 120 can be thermally coupled with the second heat sink 115 with the second contactor portion 120 in the second position 130 such that the second heat sink 115 can absorb heat from the second contactor portion 120. The second heat sink 115 can reduce the temperature of the second contactor portion 120. The second heat sink 115 can carry heat away from the second contactor portion 120.

The second heat sink 115 can comprise a thermally conductive material that is the same as the heat sink 115. The second heat sink 115 can comprise a different material than the heat sink 115. The second heat sink 115 can be positioned adjacent to the heat sink 115. The second heat sink 115 can be coupled with the heat sink 115. For example, the second heat sink 115 can be coupled with the top portion 180 of the heat sink 115. The second heat sink 115 can be coupled with the bottom portion 185 of the heat sink 115. The heat sink 115 can define a cavity or an aperture that can receive the second heat sink 115. The second heat sink 115 can define a cavity or an aperture that can receive the heat sink 115.

The contactor 100 can include a potting material thermally coupled with the heat sink 115. For example, the contactor 100 can include a potting material coupled with an outer surface of the housing 105. The potting material can comprise a thermally conductive material that can provide a pathway for heat to travel to the heat sink 115. The potting material can comprise a thermally conductive material that can provide a pathway for heat to travel away from the contactor 100 (e.g., to surrounding components). The potting material can include silicone, urethane, epoxy, or some other material. In one example, a portion of the housing 105 (e.g., the sidewall portion 165, the bottom portion 155, the top portion 160) can be coupled with the potting material. The heat sink 115 can be coupled with the potting material. The potting material can be positioned within the cavity 150 of the housing 105. The potting material can be positioned on the top portion 180 or the bottom portion 185 of the heat sink 115. The potting material can be otherwise positioned within or around the contactor 110.

The contactor 100 can include the heat sink 115 integrated into the housing 105 to thermally couple with second contactor portion 120 with the second contactor portion 120 in the second position 130. For example, the heat sink 115 can be integrated into the bottom portion 155 of the housing 105. The bottom portion 155 of the housing can comprise a molded material (e.g., plastic, rubberized material, silicone) that can be molded over the heat sink 115. The heat sink 115 can be fixedly coupled with the housing 105 via glue, epoxy, resin, adhesive compound, or some other material that permanently couples the heat sink 115 with the housing 105. The bottom portion 155 of the housing 105 can itself be the heat sink 115. For example, the bottom portion 155 of the housing can comprise a thermally conductive material that can remove heat 135 from the second contactor portion 120 with the second contactor portion 120 in the second position 130. The heat sink 115 can be non-detachably coupled with the housing 105. For example, the heat sink 115 can be coupled with the housing 105 such that the heat sink 115 cannot be removed with damaging or destroying the housing 105. A portion of the top portion 180 of the heat sink is exposed within the cavity 150 of the housing 105 such that the bottom portion 195 of the second contactor portion 120 can contact (e.g., abut, touch, mate with) the top portion 180 of the heat sink 115. At least a portion of the bottom portion 185 of the heat sink 115 is exposed outside of the housing 105 such that the bottom portion 185 of the heat sink 115 can contact some other component (e.g., neighboring component, an aluminum housing, a cold plate, a thermally conductive material).

The contactor 100 can include the heat sink 115 detachably coupled with the housing 105. For example, the heat sink 115 can be detachably coupled with the bottom portion 155 of the housing. The heat sink 115 can be installed to the bottom portion 155 of the housing 105 using at least one fastener (e.g., a screw, a rivet, a bolt, a staple). The bottom portion 155 of the housing can define a threaded aperture. The heat sink 115 can include an outer perimeter including threads that can mate with the threads of the threaded aperture of the bottom portion 155. The heat sink 115 can be coupled with the housing 105 via a non-permanent adhesive such as tape, glue, or non-curing epoxy. The heat sink 115 can be coupled with the housing 105 via some other coupling device, such as at least one clip or at least one elastic support member. A portion of the top portion 180 of the heat sink is exposed within the cavity 150 of the housing 105 such that the bottom portion 195 of the second contactor portion 120 can contact (e.g., abut, touch, mate with) the top portion 180 of the heat sink 115. At least a portion of the bottom portion 185 of the heat sink 115 is exposed outside of the housing 105 such that the bottom portion 185 of the heat sink 115 can contact some other component (e.g., neighboring component, an aluminum housing, a cold plate, a thermally conductive material).

The contactor 100 can include the heat sink 115 including at least one fin that extends away from the second contactor portion 120. For example, the bottom portion 185 of the heat sink 115 can include a fin that extends perpendicularly from the bottom portion 185 of the heat sink 115. The plurality of fins can dissipate heat. For example, the fin can increase a surface area of the heat sink 115 that is exposed to moving or stagnant air. An increased exposure to air can increase a rate at which heat can be dissipated by the heat sink 115. In one example, the fin can contact (e.g., abut, touch, mate with) a surrounding component (e.g., an aluminum housing, thermally conductive material, etc.). The fin can have a width that decreases as the fin extends from the bottom portion 185 of the heat sink 115. The fin can have a substantially uniform width (e.g., a width that varies less than ±20%). The fin can have a rectangular or elliptical cross-sectional shape. The fin can be integrally formed with the heat sink 115. The fin can be coupled with the heat sink 115. For example, the fin can be welded to the heat sink 115. In examples having a plurality of fins, each of the fins can extend from the heat sink 115 at a uniform length. The plurality of fins can extend from the heat sink 115 at varying lengths.

The contactor 100 can include the heat sink 115 including a plurality of heat sink elements, where at least one of the heat sink elements contacts the second contactor portion 120 with the second contactor portion 120 in the second position 130. For example, the heat sink 115 can include a plurality of heat sink layers. The heat sink 115 can include a first layer that includes the top portion 180 of the heat sink 115. The heat sink can include a second layer that includes the bottom portion 185 of the heat sink 115. In one example, the first layer can comprise a different material than the second layer. Each of the plurality of heat sink elements can comprise a different material than the other heat sink elements. The heat sink 115 can include a plurality of layered heat sink elements that alternate. One heat sink element can include a potting material (e.g., silicone, urethane, epoxy) that is layered on top of a second heat sink element that includes a thermally conductive metallic material. The heat sink 115 can include a plurality of heat sink elements coupled with the top portion 180 of the heat sink 115. The heat sink 115 can include a plurality of heat sink elements coupled with the bottom portion 185 of the heat sink 115.

Figure 2:
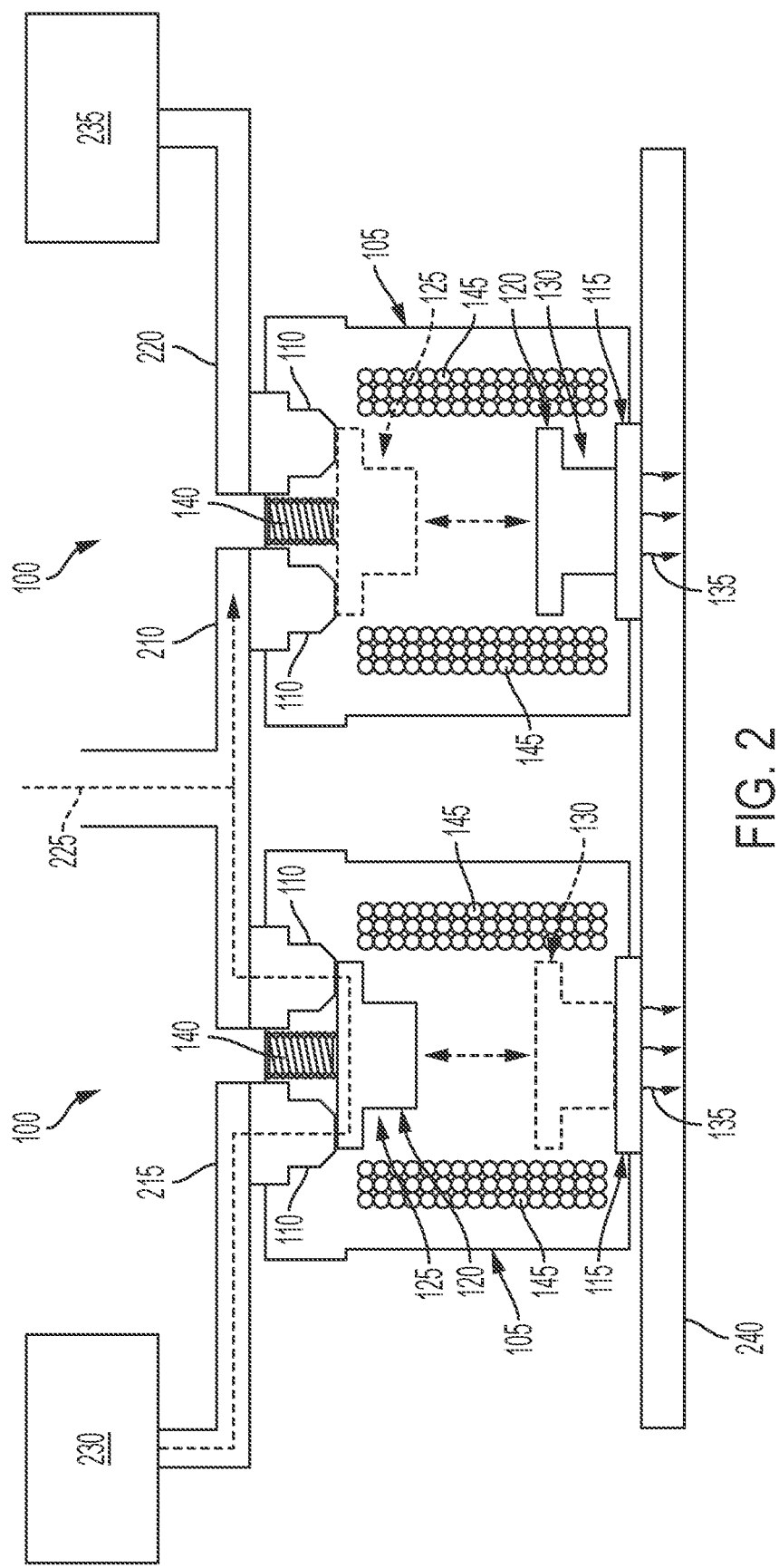
FIG. 2 depicts an example system including a contactor, in accordance with some aspects.
Figure 3:
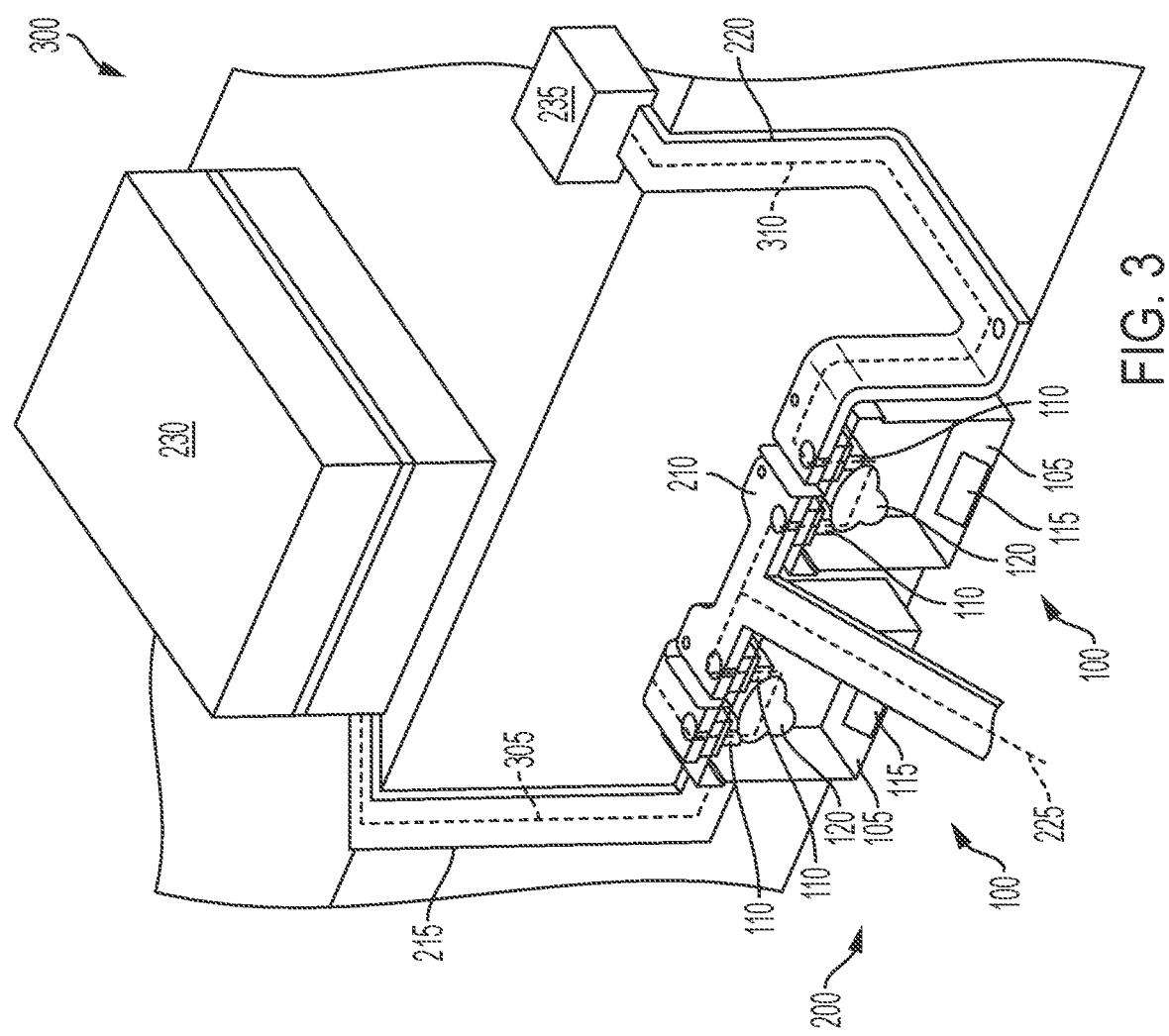
FIG. 3 depicts an example system including a contactor, in accordance with some aspects.
Figure 4:
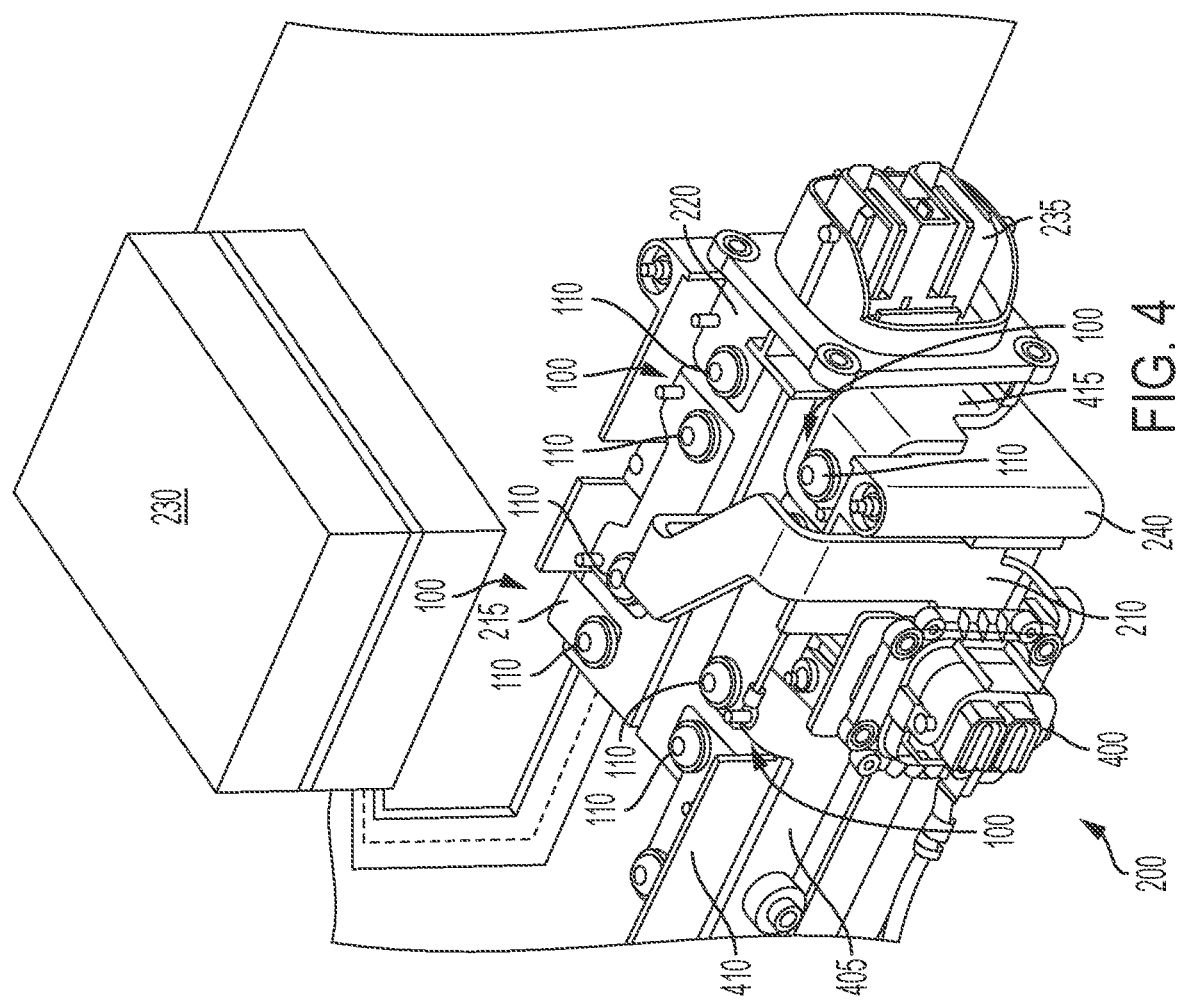
FIG. 4 depicts an example system including a contactor, in accordance with some aspects.

FIGS. 2-4, among others, depict a system 200 including the contactor 100 is shown. For example, the system 200 can include a contactor 100. The contactor 100 can include a housing 105, a first contactor portion 107 coupled with the housing 105, a heat sink 115 coupled with the housing, and a second contactor portion 120. The first contactor portion 107 can include a first contactor element 110 and a second contactor element 110. The second contactor portion 120 can contact the first contactor portion 107 with the second contactor portion 120 in a first position 125. For example, the second contactor portion 120 can contact the first contactor element 110 and the second contactor element 110 with the second contactor portion 120 in the first position 125. The second contactor portion 120 can thermally couple with the heat sink 115 with the second contactor portion in the second position 130.

The contactor 100 can include the second contactor portion 120 to thermally couple with the heat sink 115 with the second contactor portion 120 in the second position 130. For example, the bottom portion 195 of the second contactor portion 120 can contact (e.g., abut, touch, mate with) with the top portion 180 of the heat sink 115 when the second contactor portion 120 is in the second position 130. The second contactor portion 120 can be positioned relative to the heat sink 115 such that the heat sink 115 can absorb or remove heat 135 from the second contactor portion 120 with the second contactor portion 120 in the second position 130.

The system 200 can include a first busbar 210 coupled with the first contactor element 110. For example, the first contactor element 110 can be electrically coupled with the first busbar 210 such that an electrical current 225 can flow from the first contactor element 110 to the first busbar 210 or from the first busbar 210 to the first contactor element 110. The first busbar 210 can be coupled with the first contactor element 110 proximate the top portion 160 of the housing 105 outside of the cavity 150 of the housing 105. The first contactor element 110 can be or include a fastener that can couple with the first busbar 210. For example, the first busbar 210 can define an aperture that can receive the first contactor element 110. The top portion 175 of the first contactor element 110 can include a head portion similar to the head of a fastener. The head portion or similar device (e.g., a washer) can contact the first busbar 210 and compress the first busbar 210 against the top portion 160 of the housing 105, according to one example. The first busbar 210 and the first contactor element 110 can be integrally formed. For example, the first contactor element 110 can be a protrusion that extends perpendicularly from the first busbar 210. The first contactor element 110 can be received by an aperture defined by the top portion 160 of the housing 105 such that the first contactor element 110 extends into the cavity 150 and can be contacted by the second contactor portion 120 with the second contactor portion 120 in the first position 125.

The system 200 can include a second busbar 215 coupled with the second contactor element 110. For example, the second contactor element 110 can be electrically coupled with the second busbar 215 such that the electrical current 225 can flow from the second contactor element 110 to the second busbar 215 or from the second busbar 215 to the second contactor element 110. The second busbar 215 can be coupled with the second contactor element 110 proximate the top portion 160 of the housing 105 outside of the cavity 150 of the housing 105. The second contactor element 110 can be or include a fastener that can couple with the second busbar 215. For example, the second busbar 215 can define an aperture that can receive the second contactor element 110. The top portion 175 of the second contactor element 110 can include a head portion similar to the head of a fastener. The head portion or similar device (e.g., a washer) can contact the second busbar 215 and can compress the second busbar 215 against the top portion 160 of the housing 105, according to one example. The second busbar 215 and the second contactor element 110 can be integrally formed. For example, the second contactor element 110 can be a protrusion that extends perpendicularly from the second busbar 215. The second contactor element 110 can be received by an aperture defined by the top portion 160 of the housing 105 such that the second contactor element 110 extends into the cavity 150 and can be contacted by the second contactor portion 120 with the second contactor portion 120 in the first position 125.

The system 200 can include the first busbar 210, the first contactor element 110, the second contactor portion 120, the second contactor element 110, and the second busbar 215 to receive the electrical current 225 with the second contactor portion 120 in the first position 125. For example, the first busbar 210 can be coupled with the first contactor element 110. The bottom portion 170 of the first contactor element 110 can be coupled with the top portion 190 of the second contactor portion 120 with the second contactor portion 120 in the first position 125. The top portion 190 of the second contactor portion 120 can be coupled with the bottom portion 170 of the second contactor element 110. The second contactor element can be coupled with the second busbar 215. The current 225 can flow from the first busbar 210 through the first contactor element 110, through the second contactor element 120, through the second contactor element 110, and through the second busbar 215 with the second contactor element 120 in the first position 125. The current 225 can flow through the second busbar 215 through the second contactor element 110, through the second contactor element 120, through the first contactor element 110, and through the first busbar 210 with the second contactor element 120 in the first position 125. The current 225 cannot flow through the second contactor element 120 with the second contactor element 120 in the second position 130. Accordingly, the current 225 cannot flow from the first busbar 210 to the second busbar 215 via the first contactor portion 107 and the second contactor portion 120 with the second contactor portion 120 in the second position 130.

The system 200 can include a plurality of contactors 100. For example, the contactor 100 can be a first contactor 100.

The system 200 can include a second contactor 100. The second contactor 100 can include a housing 105, a first contactor portion 107 coupled with the housing 105, a heat sink 115 coupled with the housing, and a second contactor portion 120. The first contactor portion 107 can include a first contactor element 110 and a second contactor element 110. The second contactor portion 120 can contact the first contactor portion 107 with the second contactor portion 120 in a first position 125. For example, the second contactor portion 120 can contact the first contactor element 110 and the second contactor element 110 with the second contactor portion 120 in the first position 125. The second contactor portion 120 can contact the heat sink 115 with the second contactor portion in the second position 130.

As shown in FIG. 4, the system 200 can include four contactors 100. For example, the system 200 can include the first contactor 100 coupled with the first busbar 210 and the second busbar 215. The system 200 can include the second contactor 100 coupled with the first busbar 210 and the third busbar 220. The system 200 can include a third contactor 100 coupled with a fourth busbar 405 and a fifth busbar 410. The system 200 can include a fourth contactor 100 coupled with the fourth busbar 405 and a sixth busbar 415. Each of the first, second, third, and fourth contactors 100 can allow a current to flow between two busbars with the second contactor portion 120 of each contactor 100 in the first position 125.

The system 200 can include the first contactor element 110 of the second contactor 100 electrically coupled with the first busbar 210 and the second contactor element 110 of the second contactor 100 electrically coupled with a third busbar 220. For example, the first contactor element 110 of the second contactor 100 can be electrically coupled with the first busbar 210 such that the electrical current 225 can flow from the first contactor element 110 to the first busbar 210 or from the first busbar 210 to the first contactor element 110. The first busbar 210 can be coupled with the first contactor element 110 proximate the top portion 160 of the housing 105 outside of the cavity 150 of the housing 105. The second contactor element 110 of the second contactor 100 can be electrically coupled with the third busbar 220 such that the electrical current 225 can flow from the second contactor element 110 of the second contactor 100 to the third busbar 220 or from the third busbar 220 to the second contactor element 110 of the second contactor 100. The third busbar 220 can be coupled with the second contactor element 110 proximate the top portion 160 of the housing 105 outside of the cavity 150 of the housing 105.

As shown in FIGS. 3 and 4, the first busbar 210 can allow current to flow from the first contactor 100 or the second contactor 100 to a system of an electric vehicle. For example, the first busbar 210 can be electrically coupled with an electric motor of an electric vehicle, where a current 305 sent from the first contactor 100 or the second contactor 100 via the first busbar 210 can provide electrical power to the electric motor to power the electric motor. The first busbar 210 can be coupled with an electrical port 400. The electrical port 400 can be configured to provide electrical power to a device or system coupled with the port 400. For example, an electric vehicle computer system, electric motor, or other system can be coupled with the port 400 to receive electrical current from the first busbar 210. The second busbar 215 can be electrically coupled with at least one battery module 230 of a battery pack 300 of an electric vehicle. For example, the second busbar 215 can allow a current to flow to or from the battery module 230 to other components of the vehicle.

The third busbar 220 can allow current to flow from the second contactor 100 to or from a system of an electric vehicle. For example, the third busbar 220 can be coupled with a charging port 235 of an electric vehicle. The charging port 235 can receive an electrical current 310 from a charging station, wall outlet, or other power source. For example, the charging port 235 can receive direct current. The charging port 235 can provide the electrical current 310 to the second contactor 100 via the third busbar 220. The second contactor 100 can provide the electrical current 310 from the charging port 235 to another system of the electric vehicle (e.g., an electric motor, a computer system, etc.) via the first busbar 210 with the second contactor portion 120 of the second contactor 100 in the first position 125. The second contactor 100 can provide electrical current 310 from the charging port 235 to the battery module 230 via the first busbar 210 and the second busbar 215 with the second contactor portion 120 of the first contactor 100 and the second contactor portion 120 of the second contactor in the first position 125.

With the second contactor portion 120 of the first contactor 100 in the first position 125, the current 305 can flow from the battery module 230 via the second busbar 215 to at least one electric motor, auxiliary power components, or other electronics of the electric vehicle via the first busbar 210. With the second contactor portion 120 of the first contactor 100 in the second position 130 and the second contactor portion 120 of the second contactor 100 in the first position 125, the battery module 230 can be disconnected from the electric motor, auxiliary power components, and other electronics. For example, the electric vehicle could be turned off or in an idle mode. With the second contactor portion 120 of the first contactor 100 in the first position 125 and the second contactor portion 120 of the second contactor 100 in the first position 125, an electrical current can flow between the first busbar 210, the second busbar 215, and the third busbar 220. For example, a current can flow from the charging port 235 to the battery module 230 via the third busbar 220, first busbar 210, and the second busbar 215 with the second contactor portion 120 of both the first contactor 100 and the second contactor 100 in the first position 125. Current can flow from the charging port 235 to the battery module 230 to facilitate a DC current fast charging mode of the electric vehicle. For example, direct current can flow from the charging port 235 to the battery module 230. With the second contactor portion 120 of both the first contactor 100 and the second contactor 100 in the second position 130, the second busbar 215 and the third busbar 220, among others, can be de-energized or deactivated. For example, the vehicle can be off, in an idle mode, or in a sleep mode with the second contactor portion 120 of both the first contactor 100 and the second contactor 100 in the second position 130.

The system 200 can include the first busbar 210, the first contactor element 110 of the second contactor 100, the second contactor portion 120 of the second contactor 100, the second contactor element 110, and the third busbar 220 to receive an electrical current with the second contactor portion 120 of the second contactor 100 in the first position 125. For example, the first busbar 210 can be coupled with the first contactor element 110 of the second contactor 100. The bottom portion 170 of the first contactor element 110 can be coupled with the top portion 190 of the second contactor portion 120 of the second contactor 100 with the second contactor portion 120 in the first position 125. The top portion 190 of the second contactor portion 120 can be coupled with the bottom portion 170 of the second contactor element 110 of the second contactor 100. The second contactor element 110 can be coupled with the third busbar 220. A current can flow from the first busbar 210 through the first contactor element 110 of the second contactor 100, through the second contactor element 120 of the second contactor 100, through the second contactor element 110 of the second contactor 100, and through the third busbar 220 with the second contactor element 120 in the first position 125. A current can flow through the third busbar 220 through the second contactor element 110 of the second contactor 100, through the second contactor element 120 of the second contactor 100, through the first contactor element 110 of the second contactor 100, and through the first busbar 210 with the second contactor element 120 in the first position 125. A current cannot flow through the second contactor element 120 of the second contactor 100 with the second contactor element 120 in the second position 130. Accordingly, a current cannot flow between the first busbar 210 and the third busbar 220 via the first contactor portion 107 of the second contactor 100 and the second contactor portion 120 with the second contactor portion 120 in the second position 130.

The system 200 can include the heat sink 115 of the first contactor 100 thermally coupled with the heat sink 115 of the second contactor 100. For example, the heat sink 115 of the first contactor 100 and the heat sink 115 of the second contactor 100 can both be thermally coupled with a housing 240. The housing 240 can be an aluminum housing that at least partially surrounds the first contactor 100 and the second contactor 100. In one example, the heat sink 115 of the first contactor 100 and the heat sink 115 of the second contactor 100 can contact (e.g., abut, touch, mate with) the housing 240, where heat transferred from the first contactor 100 or the second contactor 100 by the heat sinks 115 can be at least partially transferred to the housing 240. The housing 240 can comprise a thermally conductive material that can absorb heat from the heat sinks 115. The heat sink 115 of the first contactor 100 and the heat sink 115 of the second contactor 100 can both be thermally coupled with a cold plate or other thermally conductive element. The heat sink 115 of the first contactor 100 and the heat sink 115 of the second contactor 100 can be integrally formed. For example, a joining member, such as a cold plate or additional heat sink, can connect the heat sink 115 of the first contactor 100 with the heat sink 115 of the second contactor 100 such that the heat sink 115 of the first contactor 100 and the heat sink 115 of the second contactor 100 are coupled together.

The system 200 can include the first contactor portion 107 and the second contactor portion 120 to receive an electrical current with second contactor portion 120 in the first position 125. For example, the second contactor portion 120 of the first contactor 100 can contact the first contactor portion 107 of the first contactor 100 with the second contactor portion 120 in the first position 125. The second contactor portion 120 of the first contactor 100 can be electrically coupled with the first contactor element 110 and the second contactor element 110 of the first contactor 100, where the first contactor element 110 can be electrically coupled with the first busbar 210 and the second contactor element 110 can be electrically coupled with the second busbar 215. An electrical current can flow between the first busbar 210 and the second busbar 215 with the second contactor portion 120 of the first contactor 100 in the first position 125. The second contactor portion 120 of the second contactor 100 can contact the first contactor portion 107 of the second contactor 100 with the second contactor portion 120 in the first position 125. The second contactor portion 120 of the second contactor 100 can be electrically coupled with the first contactor element 110 and the second contactor element 110 of the second contactor 100, where the first contactor element 110 can be electrically coupled with the first busbar 210 and the second contactor element 110 can be electrically coupled with the third busbar 220. An electrical current can flow between the first busbar 210 and the third busbar 220 with the second contactor portion 120 of the second contactor 100 in the first position 125.

The system 200 can include the heat sink 115 to remove heat 135 from the second contactor portion 120 with the second contactor portion 120 in the second position 130. For example, the heat sink 115 of the first contactor 100 can thermally couple with the second contactor portion 120 of the first contactor 100 with the second contactor portion 120 in the second position 130 to remove heat 135 from the second contactor portion 120. The heat sink 115 of the second contactor 100 can thermally couple with the second contactor portion 120 of the second contactor 100 with the second contactor portion 120 in the second position 130 to remove heat 135 from the second contactor portion 120. In either the first contactor 100 or the second contactor 100, the second contactor portion 120 may become hot (e.g., experience a rise in temperature) when in the first position 125 as current flows through the second contactor portion 120. For example, the second contactor portion 120 of the first contactor 100 can become hot as current flows between the first busbar 210 and the second busbar 215 with the second contactor portion 120 in the first position. The second contactor portion 120 of the second contactor 100 can become hot as current flows between the first busbar 210 and the third busbar 220 with the second contactor portion 120 in the first position 125.

Substantially every time (e.g., 90-100% of the time) the second contactor portion 120 of the first contactor 100 or the second contactor 100 is in the first position 125, the second contactor portion 120 is conducting electrical current and can experience an elevated temperature. When the second contactor portion 120 moves from the first position 125 to the second position 130, the second contactor portion 120 can still be at an elevated temperature. For example, the second contactor portion 120 can have a temperature that is approximately 50-250° F. hotter than surrounding components (e.g., the heat sink 115). The second contactor portion 120 can have a temperature that is 212° F. (100° C.) hotter than surrounding components.

A temperature differential can exist between the heat sink 115 of the first contactor 100 and the second contactor portion 120 of the first contactor 100 when the second contactor portion 120 moves from the first position 125 to the second position 130. A temperature differential can exist between the heat sink 115 of the second contactor 100 and the second contactor portion 120 of the second contactor 100 when the second contactor portion 120 moves from the first position 125 to the second position 130. The heat sink 115 of the first contactor 100 or the heat sink 115 of the second contactor 100 can have a lower temperature than the respective second contactor portion 120 in some scenarios. The heat sinks 115 of the first contactor 100 and the second contactor 100 can absorb heat from the respective second contactor portion 120 with the second contactor portion 120 in the second position 130. The heat sinks 115 can absorb heat from the respective second contactor portion 120 to reduce the temperature of the second contactor portion 120. The heat sinks 115 can draw heat away from the respective second contactor portion 120. For example, the heat sink 115 can transfer heat from the top portion 180 of the heat sink 115 that is absorbed from the bottom portion 195 of the second contactor portion 120 and transfer the heat to the bottom portion 185 of the heat sink 115. A temperature of each second contactor portion 120 can be reduced with the second contactor portion 120 while in the second position 130 and thermally coupled to the respective heat sink 115.

Figure 5:
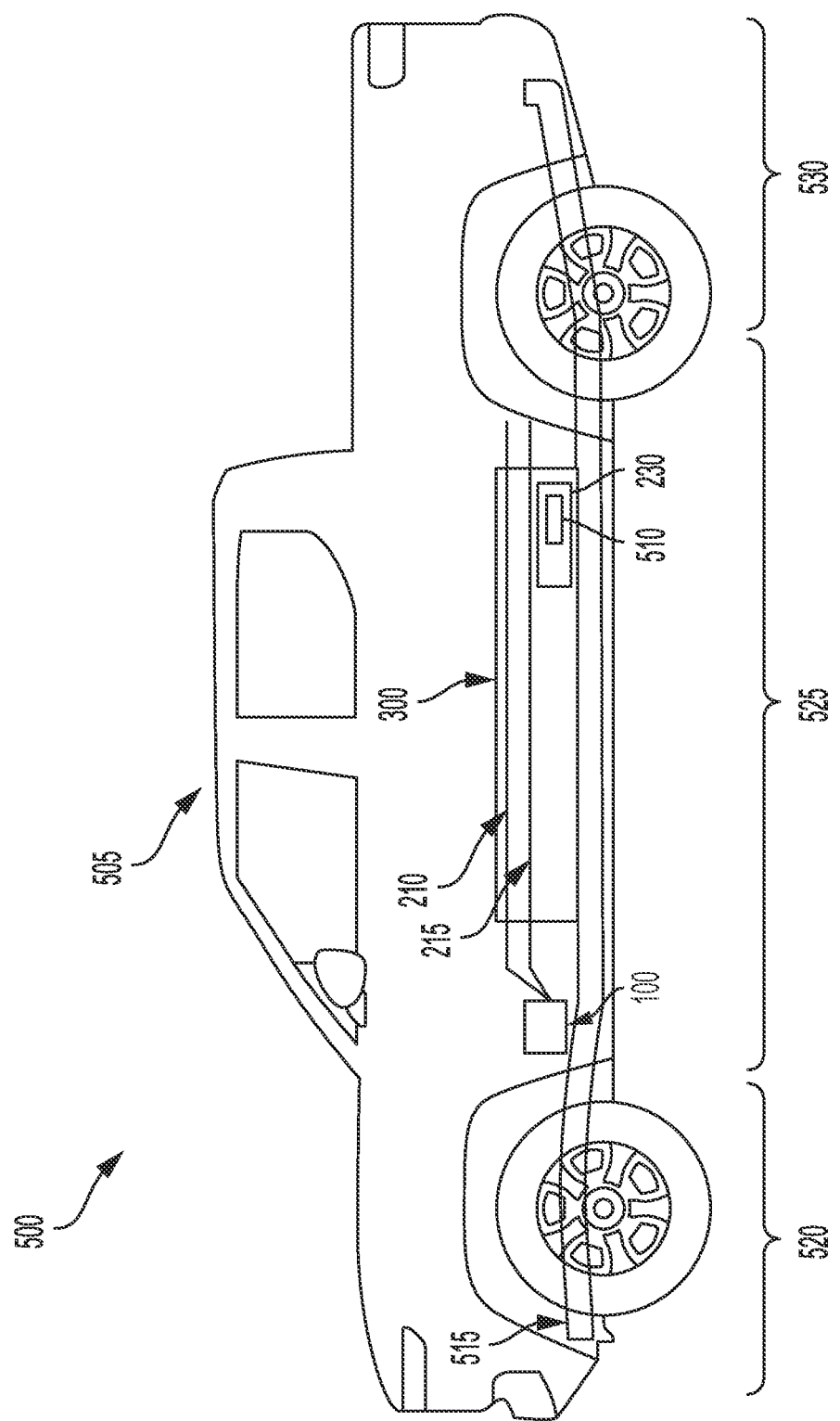
FIG. 5 depicts an example electric vehicle, in accordance with some aspects.

FIG. 5 depicts an example cross-sectional view 500 of an electric vehicle 505 installed with at least one battery pack 300. Electric vehicles 505 can include electric trucks, electric sport utility vehicles (SUVs), electric delivery vans, electric automobiles, electric cars, electric motorcycles, electric scooters, electric passenger vehicles, electric passenger or commercial trucks, hybrid vehicles, or other vehicles such as sea or air transport vehicles, planes, helicopters, submarines, boats, or drones, among other possibilities. The battery pack 300 can also be used as an energy storage system to power a building, such as a residential home or commercial building. Electric vehicles 505 can be fully electric or partially electric (e.g., plug-in hybrid) and further, electric vehicles 505 can be fully autonomous, partially autonomous, or unmanned. Electric vehicles 505 can also be human operated or non-autonomous. Electric vehicles 505 such as electric trucks or automobiles can include on-board battery packs 300, battery modules 230, or battery cells 510 to power the electric vehicles. The electric vehicle 505 can include a chassis 515 (e.g., a frame, internal frame, or support structure). The chassis 515 can support various components of the electric vehicle 505. The chassis 515 can span a front portion 520 (e.g., a hood or bonnet portion), a body portion 525, and a rear portion 530 (e.g., a trunk, payload, or boot portion) of the electric vehicle 505. The battery pack 300 can be installed or placed within the electric vehicle 505. For example, the battery pack 300 can be installed on the chassis 515 of the electric vehicle 505 within one or more of the front portion 520, the body portion 525, or the rear portion 530.

The battery pack 300 can include or connect with at least one busbar, e.g., a current collector element. For example, the electric vehicle 505 can include the battery pack 300 electrically coupled with at least one of the first busbar 210 and the second busbar 215. The first busbar 210 and the second busbar 215 can include electrically conductive material to connect or otherwise electrically couple the battery modules 230 or the battery cells 510 with other electrical components of the electric vehicle 505 to provide electrical power to various systems or components of the electric vehicle 505.

The electric vehicle 505 can include the contactor 100. The contactor 100 can include the housing 105, the first contactor portion 107 coupled with the housing 105, the heat sink 115 coupled with the housing 105, and the second contactor portion. The first contactor portion 107 can include the first contactor element 110 and the second contactor element 110. The second contactor portion can contact the first contactor portion 107 with the second contactor portion 120 in the first position 125. The second contactor portion 120 can thermally couple with the heat sink 115 with the second contactor portion 120 in the second position.

The electric vehicle 505 can include the first contactor element 110 coupled with the first busbar 210 and the second contactor element 110 coupled with the second busbar 215. For example, the first contactor element 110 can be electrically coupled with the first busbar 210 such that an electrical current can flow from the first contactor element 110 to the first busbar 210 or from the first busbar 210 to the first contactor element 110. The first busbar 210 can be coupled with the first contactor element 110 proximate the top portion 160 of the housing 105 outside of the cavity 150 of the housing 105. The second contactor element 110 can be electrically coupled with the second busbar 215 such that the electrical current 225 can flow from the second contactor element 110 to the second busbar 215 or from the second busbar 215 to the second contactor element 110. The second busbar 215 can be coupled with the second contactor element 110 proximate the top portion 160 of the housing 105 outside of the cavity 150 of the housing 105.

The contactor 100 can include the second contactor portion 120 to thermally couple with the heat sink 115 with the second contactor portion 120 in the second position 130. For example, the bottom portion 195 of the second contactor portion 120 can contact (e.g., abut, touch, mate with) with the top portion 180 of the heat sink 115 when the second contactor portion 120 is in the second position 130. The second contactor portion 120 can be positioned relative to the heat sink 115 such that the heat sink 115 can absorb or remove heat 135 from the second contactor portion 120 with the second contactor portion 120 in the second position 130.

The electric vehicle 505 can include the first contactor portion 107 and the second contactor portion 120 to receive an electrical current with second contactor portion 120 in the first position 125. For example, the second contactor portion 120 of the first contactor 100 can contact the first contactor portion 107 of the first contactor 100 with the second contactor portion 120 in the first position 125. The second contactor portion 120 of the first contactor 100 can be electrically coupled with the first contactor element 110 and the second contactor element 110 of the first contactor 100, where the first contactor element 110 can be electrically coupled with the first busbar 210 and the second contactor element 110 can be electrically coupled with the second busbar 215. An electrical current can flow between the first busbar 210 and the second busbar 215 with the second contactor portion 120 of the first contactor 100 in the first position 125. The second contactor portion 120 of the second contactor 100 can contact the first contactor portion 107 of the second contactor 100 with the second contactor portion 120 in the first position 125. The second contactor portion 120 of the second contactor 100 can be electrically coupled with the first contactor element 110 and the second contactor element 110 of the second contactor 100, where the first contactor element 110 can be electrically coupled with the first busbar 210 and the second contactor element 110 can be electrically coupled with the third busbar 220. An electrical current can flow between the first busbar 210 and the third busbar 220 with the second contactor portion 120 of the second contactor 100 in the first position 125.

The electric vehicle 505 can include the heat sink 115 to remove heat 135 from the second contactor portion 120 with the second contactor portion 120 in the second position 130. For example, the heat sink 115 can thermally couple with the second contactor portion 120 with the second contactor portion 120 in the second position 130 to remove heat 135 from the second contactor portion 120. The second contactor portion 120 can become hot (e.g., experience a rise in temperature) when in the first position 125 as current flows through the second contactor portion 120. For example, the second contactor portion 120 of the first contactor 100 can become hot as current flows between the first busbar 210 and the second busbar 215 with the second contactor portion 120 in the first position 125. The second contactor portion 120 of the second contactor 100 can become hot as current flows between the first busbar 210 and the third busbar 220 with the second contactor portion 120 in the first position 125.

Substantially every time (e.g., 90-100% of the time) the second contactor portion 120 of the first contactor 100 or the second contactor 100 is in the first position 125, the second contactor portion 120 is conducting electrical current and can experience an elevated temperature. When the second contactor portion 120 moves from the first position 125 to the second position 130, the second contactor portion 120 can still be at an elevated temperature. For example, the second contactor portion 120 can have a temperature that is approximately 50-250° F. hotter than surrounding components (e.g., the heat sink 115). The second contactor portion 120 can have a temperature that is 212° F. (100° C.) hotter than surrounding components.

Figure 6:
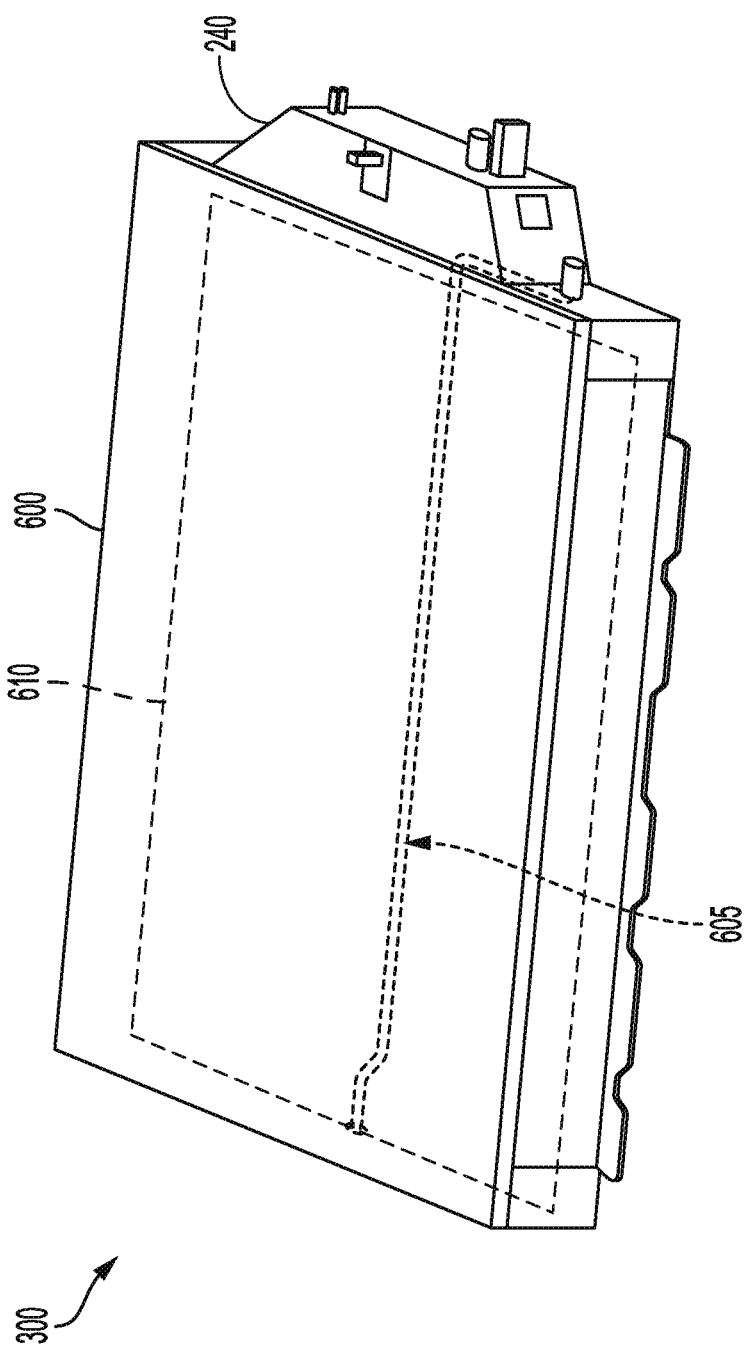
FIG. 6 depicts an example battery pack, in accordance with some aspects.

FIG. 6 depicts an example battery pack 300. Referring to FIG. 6, among others, the battery pack 300 can provide power to electric vehicle 505. Battery packs 300 can include any arrangement or network of electrical, electronic, mechanical or electromechanical devices to power a vehicle of any type, such as the electric vehicle 505. The battery pack 300 can include at least one housing 600. The housing 600 can include at least one battery module 230 or at least one battery cell 510, as well as other battery pack components. The housing 600 can include a shield on the bottom or underneath the battery module 230 to protect the battery module 230 from external conditions, for example if the electric vehicle 505 is driven over rough terrains (e.g., off-road, trenches, rocks, etc.) The housing 600 can include or can be coupled with the housing 245. The battery pack 300 can include at least one cooling line 605 that can distribute fluid through the battery pack 300 as part of a thermal/temperature control or heat exchange system that can also include at least one thermal component (e.g., a cold plate) 610. The thermal component 610 can be positioned in relation to a top submodule and a bottom submodule, such as in between the top and bottom submodules, among other possibilities. The battery pack 300 can include any number of thermal components 610. For example, there can be one or more thermal components 610 per battery pack 300, or per battery module 230. At least one cooling line 605 can be coupled with, part of, or independent from the thermal component 610.

Figure 7:
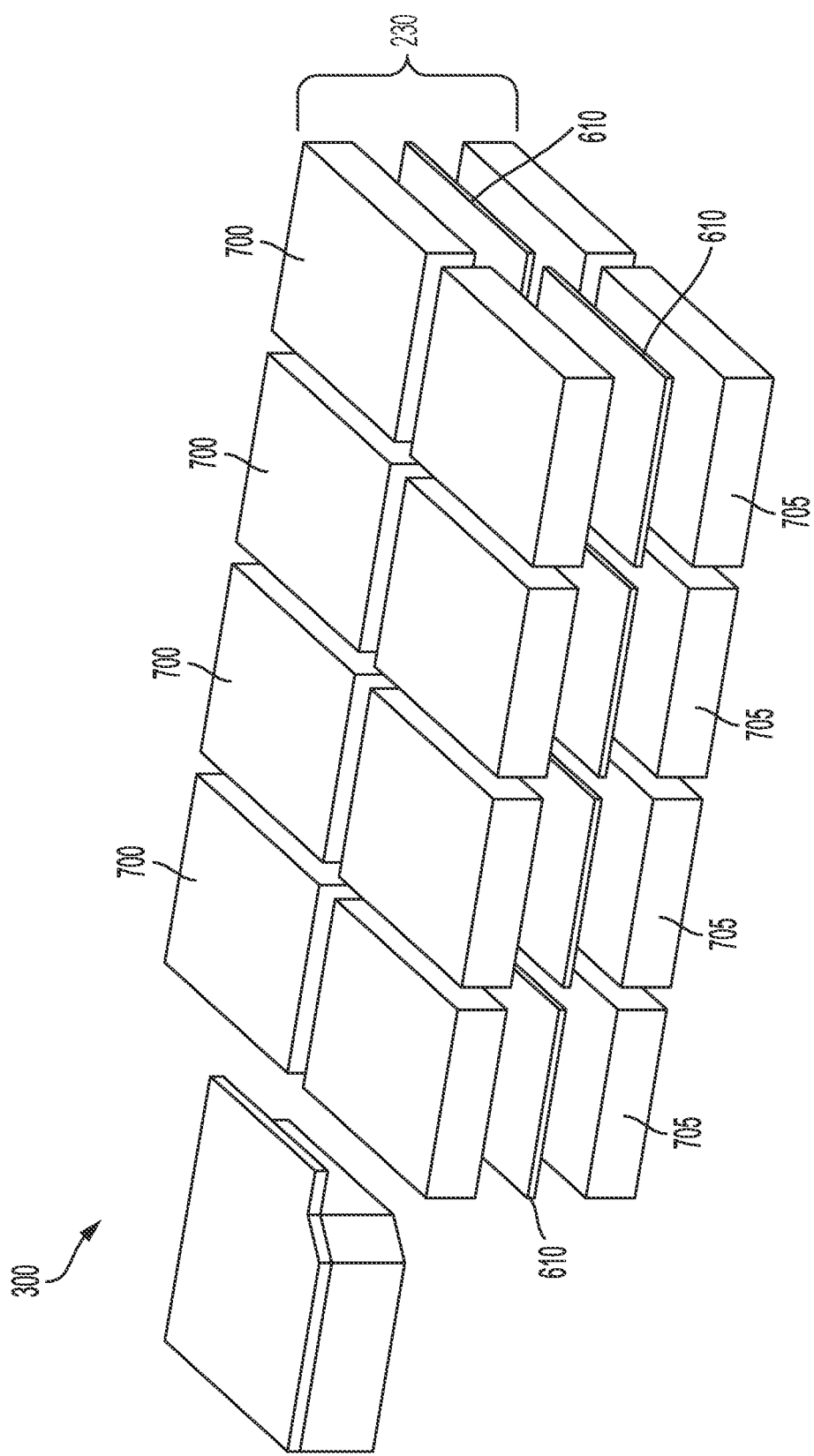
FIG. 7 depicts an example battery module, in accordance with some aspects.
Figure 8:
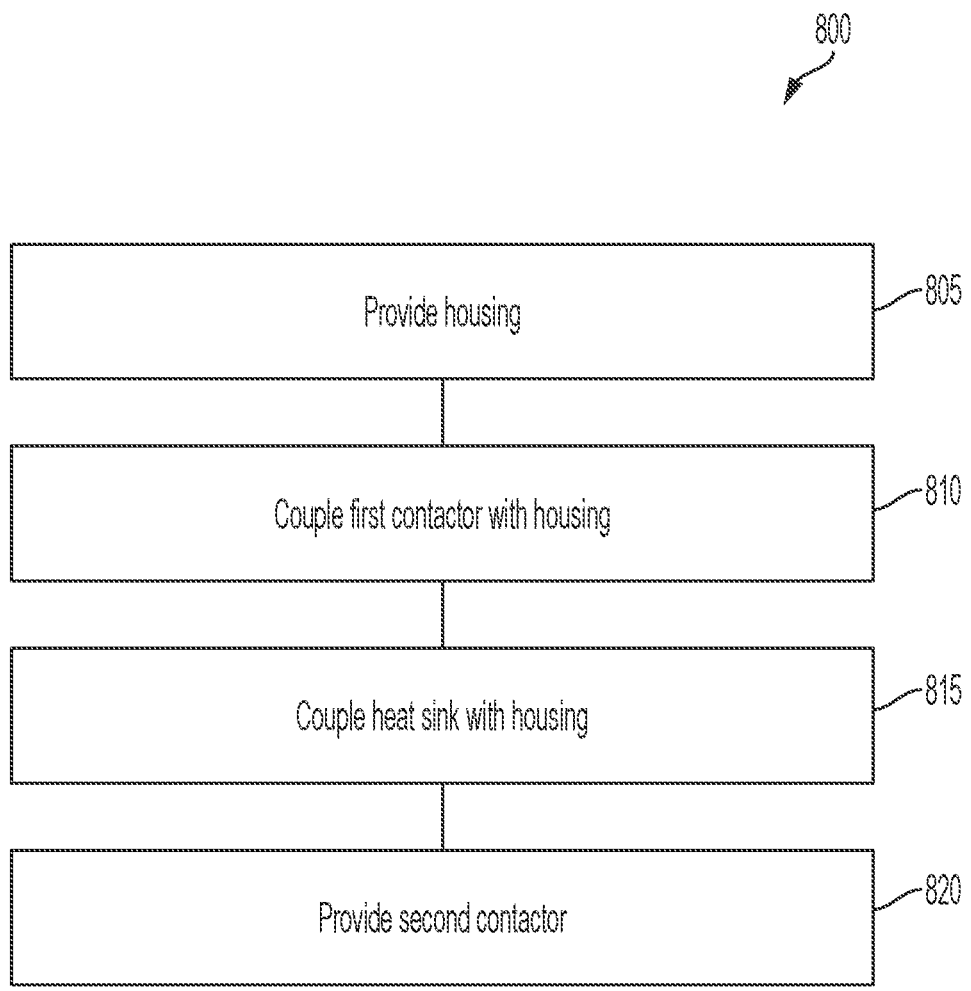
FIG. 8 is a flow diagram of an example method, in accordance with some aspects.

FIG. 7 depicts example battery modules 230, and FIG. 8 depicts an example cross sectional view of a battery cell 510. The battery modules 230 can include at least one submodule. For example, the battery modules 230 can include at least one top submodule 700 or at least one bottom submodule 705. At least one thermal component 610 can be disposed between the top submodule 700 and the bottom submodule 705. For example, one thermal component 610 can be configured for heat exchange with one battery module 230. The cold plate 610 can be disposed or thermally coupled between the top submodule 700 and the bottom submodule 705. One thermal component 610 can also be thermally coupled with more than one battery module 230 (or more than two submodules 700, 705). The battery submodules 700, 705 can collectively form one battery module 230. Each submodule 700, 705 can be considered as a complete battery module 230, rather than a submodule. The thermal component 610 can be thermally coupled to the contactors 100. For example, the thermal component 610 can be a cold plate that is thermally coupled with the first portion 107 of the contactor 100. The thermal component 610 remove heat from the contactor with the second contactor portion 120 in the first position 125.

The battery modules 230 can each include a plurality of battery cells 510. The battery modules 230 can be disposed within the housing 600 of the battery pack 300. The battery modules 230 can include battery cells 510 that are cylindrical cells or prismatic cells, for example. The battery module 230 can operate as a modular unit of battery cells 510. For example, a battery module 230 can collect current or electrical power from the battery cells 510 that are included in the battery module 230 and can provide the current or electrical power as output from the battery pack 300. The battery pack 300 can include any number of battery modules 230. For example, the battery pack 300 can have one, two, three, four, five, six, seven, eight, nine, ten, eleven, twelve or other number of battery modules 230 disposed in the housing 600. It should also be noted that each battery module 230 may include a top submodule 700 and a bottom submodule 705, possibly with a thermal component 610 in between the top submodule 700 and the bottom submodule 705. The battery pack 300 can include or define a plurality of areas for positioning of the battery module 230. The battery modules 230 can be square, rectangular, circular, triangular, symmetrical, or asymmetrical. Battery modules 230 may be different shapes, such that some battery modules 230 are rectangular but other battery modules 230 are square shaped, among other possibilities. The battery module 230 can include or define a plurality of slots, holders, or containers for a plurality of battery cells 510.

Battery cells 510 have a variety of form factors, shapes, or sizes. For example, battery cells 510 can have a cylindrical, rectangular, square, cubic, flat, or prismatic form factor. Battery cells 510 can be assembled, for example, by inserting a winded or stacked electrode roll (e.g., a jelly roll) including electrolyte material into at least one battery cell housing. The electrolyte material, e.g., an ionically conductive fluid or other material, can generate or provide electric power for the battery cell 510. A first portion of the electrolyte material can have a first polarity, and a second portion of the electrolyte material can have a second polarity. The housing can be of various shapes, including cylindrical or rectangular, for example. Electrical connections can be made between the electrolyte material and components of the battery cell 510. For example, electrical connections with at least some of the electrolyte material can be formed at two points or areas of the battery cell 510, for example to form a first polarity terminal (e.g., a positive or anode terminal) and a second polarity terminal (e.g., a negative or cathode terminal). The polarity terminals can be made from electrically conductive materials to carry electrical current from the battery cell 510 to an electrical load, such as a component or system of the electric vehicle 505.

For example, the battery cell 510 can include a lithium-ion battery cells. In lithium-ion battery cells, lithium ions can transfer between a positive electrode and a negative electrode during charging and discharging of the battery cell. For example, the battery cell anode can include lithium or graphite, and the battery cell cathode can include a lithium-based oxide material. The electrolyte material can be disposed in the battery cell 510 to separate the anode and cathode from each other and to facilitate transfer of lithium ions between the anode and cathode. It should be noted that battery cell 510 can also take the form of a solid state battery cell developed using solid electrodes and solid electrolytes. Yet further, some battery cells 510 can be solid state battery cells and other battery cells 510 can include liquid electrolytes for lithium-ion battery cells.

The battery cell 510 can be included in battery modules 230 or battery packs 300 to power components of the electric vehicle 505. The battery cell housing can be disposed in the battery module 230, the battery pack 300, or a battery array installed in the electric vehicle 505. The housing can be of any shape, such as cylindrical with a circular (e.g., as depicted), elliptical, or ovular base, among others. The shape of the housing can also be prismatic with a polygonal base, such as a triangle, a square, a rectangle, a pentagon, and a hexagon, among others.

The housing of the battery cell 510 can include one or more materials with various electrical conductivity or thermal conductivity, or a combination thereof. The electrically conductive and thermally conductive material for the housing of the battery cell 510 can include a metallic material, such as aluminum, an aluminum alloy with copper, silicon, tin, magnesium, manganese, or zinc (e.g., aluminum 1000, 4000, or 5000 series), iron, an iron-carbon alloy (e.g., steel), silver, nickel, copper, and a copper alloy, among others. The electrically insulative and thermally conductive material for the housing of the battery cell 510 can include a ceramic material (e.g., silicon nitride, silicon carbide, titanium carbide, zirconium dioxide, beryllium oxide, and among others) and a thermoplastic material (e.g., polyethylene, polypropylene, polystyrene, polyvinyl chloride, or nylon), among others.

The battery cell 510 can include at least one anode layer, which can be disposed within the cavity defined by the housing. The anode layer can receive electrical current into the battery cell 510 and output electrons during the operation of the battery cell 510 (e.g., charging or discharging of the battery cell 510). The anode layer can include an active substance. The active substance can include, for example, an activated carbon or a material infused with conductive materials (e.g., artificial or natural Graphite, or blended), lithium titanate ($Li_4Ti_5O_{12}$), or a silicon-based material (e.g., silicon metal, oxide, carbide, pre-lithiated).

The battery cell 510 can include at least one cathode layer (e.g., a composite cathode layer compound cathode layer, a compound cathode, a composite cathode, or a cathode). The cathode layer can be disposed within the cavity. The cathode layer can output electrical current out from the battery cell 510 and can receive electrons during the discharging of the battery cell 510. The cathode layer can also release lithium ions during the discharging of the battery cell 510. Conversely, the cathode layer can receive electrical current into the battery cell 510 and can output electrons during the charging of the battery cell 510. The cathode layer can receive lithium ions during the charging of the battery cell 510.

The battery cell 510 can include an electrolyte layer disposed within the cavity. The electrolyte layer can be arranged between the anode layer and the cathode layer to separate the anode layer and the cathode layer. The electrolyte layer can transfer ions between the anode layer and the cathode layer. The electrolyte layer can transfer cations from the anode layer to the cathode layer during the operation of the battery cell 510. The electrolyte layer can transfer anions (e.g., lithium ions) from the cathode layer to the anode layer during the operation of the battery cell 510.

The electrolyte layer can include or be made of a liquid electrolyte material. The liquid electrolyte material can include a lithium salt dissolved in a solvent. The lithium salt for the liquid electrolyte material for the electrolyte layer can include, for example, lithium tetrafluoroborate ($LiBF_4$), lithium hexafluorophosphate ($LiPF_6$), and lithium perchlorate ($LiClO_4$), among others. The solvent can include, for example, dimethyl carbonate (DMC), ethylene carbonate (EC), and diethyl carbonate (DEC), among others. The electrolyte layer can include or be made of a solid electrolyte material, such as a ceramic electrolyte material, polymer electrolyte material, or a glassy electrolyte material, or among others, or any combination thereof. The ceramic electrolyte material for the electrolyte layer can include, for example, lithium phosphorous oxy-nitride ($Li_xPO_yN_z$), lithium germanium phosphate sulfur ($Li_{10}GeP_2S_{12}$), Yttria-stabilized Zirconia (YSZ), NASICON ($Na_3Zr_2Si_2PO_{12}$), beta-alumina solid electrolyte (BASE), perovskite ceramics (e.g., strontium titanate ($SrTiO_3$)), among others. The polymer electrolyte material (e.g., a hybrid or pseudo-solid state electrolyte) for electrolyte layer can include, for example, polyacrylonitrile (PAN), polyethylene oxide (PEO), polymethyl-methacrylate (PMMA), and polyvinylidene fluoride (PVDF), among others. The glassy electrolyte material for the electrolyte layer can include, for example, lithium sulfide-phosphor pentasulfide ($Li_2S$—$P_2S_5$), lithium sulfide-boron sulfide ($Li_2S$—$B_2S_3$), and Tin sulfide-phosphor pentasulfide ($SnS$—$P_2S_5$), among others.

FIG. 8 depicts an example method 800 of manufacturing a contactor 100. The method can include one or more of ACTS 805-820. The method 800 can include providing a housing 105 at ACT 805. For example, the housing 105 can be the housing 105 shown in FIGS. 1 and 2 and described above. Accordingly, the housing 105 can define the cavity 150. The housing can include the bottom portion 155, the top portion 160, and the sidewall portion 165.

The method 800 can include coupling a first contactor with the housing 105 at ACT 810. For example, the first contactor can be the first contactor portion 107 shown in FIGS. 1 and 2 and described above. The first contactor portion 107 can include the first contactor element 110 and the second contactor element 110. The first contactor element 110 and the second contactor element 110 can include the bottom portion 170 and the top portion 175. The first contactor element 110 and the second contactor element 110 can be coupled with the top portion 160 of the housing 105. For example, the bottom portion 170 can extend perpendicularly from the top portion 160 into the cavity 150 towards the bottom portion 155. The top portion 175 of the first contactor element 110 and the second contactor element 110 can extend from the top portion 160 of the housing 105 and outside of the cavity 150 of the housing 105. The contactor element 110 can couple with a busbar. For example, a busbar can be coupled with the first contactor element 110 or the second contactor element 110 proximate the top portion 160 of the housing 105 outside of the cavity 150 of the housing 105. The first contactor element 110 or the second contactor element 110 can be or include a fastener that can couple with the busbar, according to one example. The first contactor element 110 or the second contactor element 110 can conduct current (e.g., allow an electrical current to flow through at least a portion of the contactor element 110). The first contactor element 110 or the second contactor element 110 can allow current to flow from the top portion 175 to the bottom portion 170, from the bottom portion 170 to the top portion 175, or otherwise.

The method 800 can include coupling the heat sink 115 with the housing 105 at ACT 815. For example, the heat sink 115 can be coupled with the bottom portion 155 of the housing 105. The heat sink 115 can include the top portion 180 and the bottom portion 195. The heat sink 115 can be coupled to permanently (e.g., non-detachably) coupled with the housing 105. The heat sink 115 can be detachably coupled with the housing 105. The heat sink 115 can be integrated with the housing 105. The heat sink 115 can comprise a thermally conductive material that can absorb, transfer, or dissipate heat. The heat sink 115 can include a plurality of heat sink elements. In one example, a plurality of heat sinks 115 can be coupled with the housing 105.

The method 800 can include providing a second contactor at ACT 820. For example, the second contactor can be the second contactor portion 120 shown in FIGS. 1 and 2 and as described above. The second contactor portion can include the top portion 190 and the bottom portion 195. The second contactor portion 120 can be positioned within the cavity 150 of the housing. The second contactor portion 120 can move between a first position 125 and a second position 130. The second contactor portion 120 can contact the first contactor portion 107 with the second contactor portion 120 in the first position 125. For example, the top portion 190 of the second contactor portion 120 can contact (e.g., abut, touch, mate with) the bottom portion 170 of the first contactor element 110 and the bottom portion 170 of the second contactor element 110. The second contactor portion 120 and the first contactor portion 107 can be electrically coupled with the second contactor portion 120 in the first position. The second contactor portion 120 can thermally couple with the heat sink 115 with the second contactor portion 120 in the second position 130. For example, the bottom portion 195 of the second contactor portion 120 can be positioned relative to the top portion 180 of the heat sink 115 such that heat can be transferred between the heat sink 115 and the second contactor portion 120 with the second contactor portion 120 in the second position 130.

Figure 9:
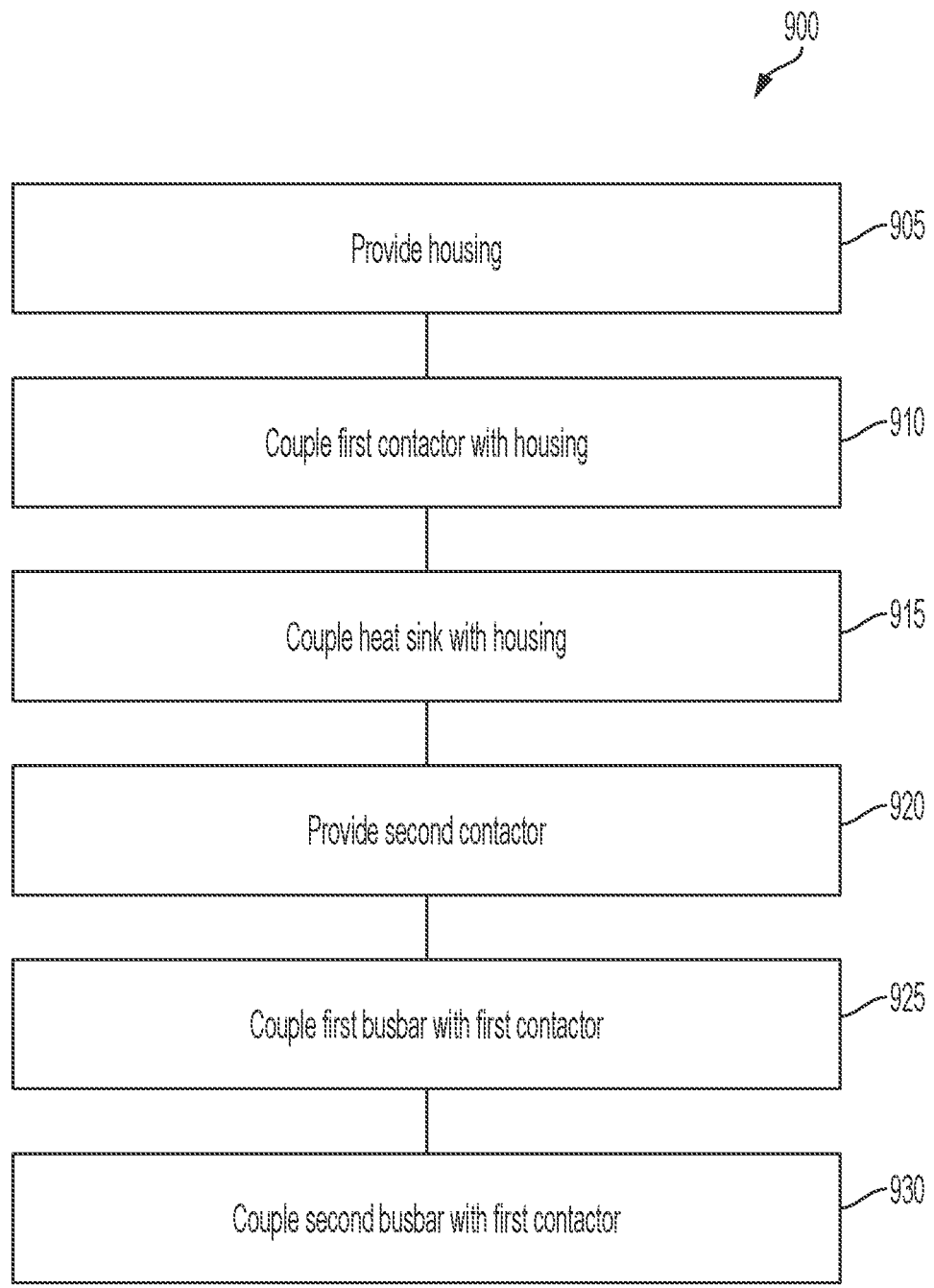
FIG. 9 is a flow diagram of an example method, in accordance with some aspects.

FIG. 9 depicts an example method 900 of providing a system including a contactor 100. The method 900 can include at least one of the ACTS 905-930. The method 900 can include providing a housing 105 at ACT 905. For example, the housing 105 can be the housing 105 shown in FIGS. 1 and 2 and described above. Accordingly, the housing 105 can define the cavity 150. The housing can include the bottom portion 155, the top portion 160, and the sidewall portion 165.

The method 900 can include coupling a first contactor with the housing 105 at ACT 910. For example, the first contactor can be the first contactor portion 107 shown in FIGS. 1 and 2 and described above. The first contactor portion 107 can include the first contactor element 110 and the second contactor element 110. The first contactor element 110 and the second contactor element 110 can include the bottom portion 170 and the top portion 175. The first contactor element 110 and the second contactor element 110 can be coupled with the top portion 160 of the housing 105. For example, the bottom portion 170 can extend perpendicularly from the top portion 160 into the cavity 150 towards the bottom portion 155. The top portion 175 of the first contactor element 110 and the second contactor element 110 can extend from the top portion 160 of the housing 105 and outside of the cavity 150 of the housing 105. The first contactor element 110 or the second contactor element 110 can conduct current (e.g., allow an electrical current to flow through at least a portion of the contactor element 110). The first contactor element 110 or the second contactor element 110 can allow current to flow from the top portion 175 to the bottom portion 170, from the bottom portion 170 to the top portion 175, or otherwise.

The method 900 can include coupling the heat sink 115 with the housing 105 at ACT 915. For example, the heat sink 115 can be coupled with the bottom portion 155 of the housing 105. The heat sink 115 can include the top portion 180 and the bottom portion 195. The heat sink 115 can be coupled to permanently (e.g., non-detachably) coupled with the housing 105. The heat sink 115 can be detachably coupled with the housing 105. The heat sink 115 can be integrated with the housing 105. The heat sink 115 can comprise a thermally conductive material that can absorb, transfer, or dissipate heat. The heat sink 115 can include a plurality of heat sink elements. In one example, a plurality of heat sinks 115 can be coupled with the housing 105.

The method 900 can include providing a second contactor at ACT 920. For example, the second contactor can be the second contactor portion 120 shown in FIGS. 1 and 2 and as described above. The second contactor portion can include the top portion 190 and the bottom portion 195. The second contactor portion 120 can be positioned within the cavity 150 of the housing. The second contactor portion 120 can move between a first position 125 and a second position 130. The second contactor portion 120 can contact the first contactor portion 107 with the second contactor portion 120 in the first position 125. For example, the top portion 190 of the second contactor portion 120 can contact (e.g., abut, touch, mate with) the bottom portion 170 of the first contactor element 110 and the bottom portion 170 of the second contactor element 110. The second contactor portion 120 and the first contactor portion 107 can be electrically coupled with the second contactor portion 120 in the first position. The second contactor portion 120 can thermally couple with the heat sink 115 with the second contactor portion 120 in the second position 130. For example, the bottom portion 195 of the second contactor portion 120 can be positioned relative to the top portion 180 of the heat sink 115 such that heat can be transferred between the heat sink 115 and the second contactor portion 120 with the second contactor portion 120 in the second position 130.

The method 900 can include coupling a first busbar with the first contactor at ACT 925. For example, the first busbar 210 can be coupled with the first contactor element 110 of the first contactor portion 107. The first contactor element 110 can be electrically coupled with the first busbar 210 such that an electrical current 225 can flow from the first contactor element 110 to the first busbar 210 or from the first busbar 210 to the first contactor element 110. The first busbar 210 can be coupled with the first contactor element 110 proximate the top portion 160 of the housing 105 outside of the cavity 150 of the housing 105. The first contactor element 110 can be or include a fastener that can couple with the first busbar 210. For example, the first busbar 210 can define an aperture that can receive the first contactor element 110. The top portion 175 of the first contactor element 110 can include a head portion similar to the head of a fastener. The head portion or similar device (e.g., a washer) can contact the first busbar 210 and compress the first busbar 210 against the top portion 160 of the housing 105, according to one example. The first busbar 210 and the first contactor element 110 can be integrally formed. For example, the first contactor element 110 can be a protrusion that extends perpendicularly from the first busbar 210. The first contactor element 110 can be received by an aperture defined by the top portion 160 of the housing 105 such that the first contactor element 110 extends into the cavity 150 and can be contacted by the second contactor portion 120 with the second contactor portion 120 in the first position 125.

The method 900 can include coupling a second busbar with the second contactor at ACT 930. For example, the second busbar 215 can be coupled with the second contactor element 110 of the first contactor portion 107. The second contactor element 110 can be electrically coupled with the second busbar 215 such that an electrical current can flow from the second contactor element 110 to the second busbar 215 or from the second busbar 215 to the second contactor element 110. The second busbar 215 can be coupled with the second contactor element 110 proximate the top portion 160 of the housing 105 outside of the cavity 150 of the housing 105. The second contactor element 110 can be or include a fastener that can couple with the second busbar 215. For example, the second busbar 215 can define an aperture that can receive the second contactor element 110. The top portion 175 of the second contactor element 110 can include a head portion similar to the head of a fastener. The head portion or similar device (e.g., a washer) can contact the second busbar 215 and can compress the second busbar 215 against the top portion 160 of the housing 105, according to one example. The second busbar 215 and the second contactor element 110 can be integrally formed. For example, the second contactor element 110 can be a protrusion that extends perpendicularly from the second busbar 215. The second contactor element 110 can be received by an aperture defined by the top portion 160 of the housing 105 such that the second contactor element 110 extends into the cavity 150 and can be contacted by the second contactor portion 120 with the second contactor portion 120 in the first position 125.

An electrical current can flow through the first busbar 210, the first contactor element 110, the second contactor portion 120, the second contactor element 110 and the second busbar 215 to receive the electrical current 225 with the second contactor portion 120 in the first position 125. For example, the first busbar 210 can be coupled with the first contactor element 110. The bottom portion 170 of the first contactor element 110 can be coupled with the top portion 190 of the second contactor portion 120 with the second contactor portion 120 in the first position 125. The top portion 190 of the second contactor portion 120 can be coupled with the bottom portion 170 of the second contactor element 110. The second contactor element can be coupled with the second busbar 215. An electrical current can flow from the first busbar 210 through the first contactor element 110, through the second contactor element 120, through the second contactor element 110, and through the second busbar 215 with the second contactor element 120 in the first position 125. An electrical current can flow through the second busbar 215 through the second contactor element 110, through the second contactor element 120, through the first contactor element 110, and through the first busbar 210 with the second contactor element 120 in the first position 125. An electrical current cannot flow through the second contactor element 120 with the second contactor element 120 in the second position 130. Accordingly, an electrical current cannot flow from the first busbar 210 to the second busbar 215 via the first contactor portion 107 and the second contactor portion 120 with the second contactor portion 120 in the second position 130.

Figure 10:
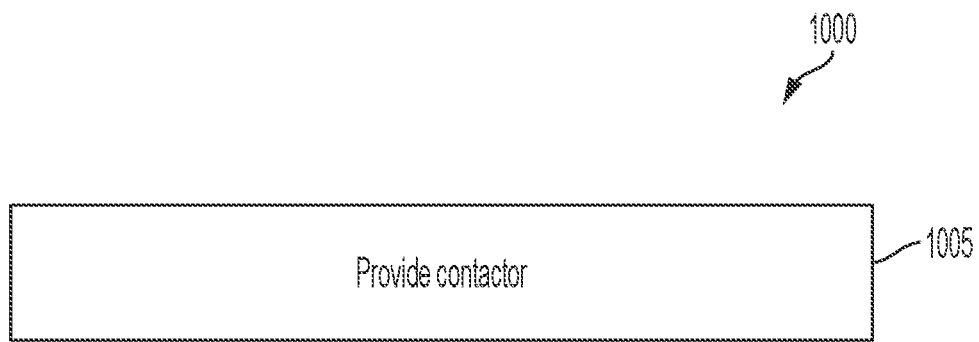
FIG. 10 is a flow diagram of an example method, in accordance with some aspects.

FIG. 10 depicts an example method 1000 of providing a contactor. The method 1000 can include ACT 1005. The method can include providing a contactor at ACT 1005. For example, the contactor can be the contactor 100. The contactor 100 can include the housing 105, the first contactor portion 107, the heat sink 115, and the second contactor portion 120. The first contactor portion 107 can include the first contactor element 110 and the second contactor element 110. The second contactor portion 120 can move between the first position 125 and the second position 130. The second contactor portion 120 can contact (e.g., abut, touch, mate with) the first contactor portion 107 with the second contactor portion 120 in the first position 125. For example, the top portion 190 of the second contactor portion 120 can contact the bottom portion 170 of the first contactor element 110 and the bottom portion 170 of the second contactor element 110 with the second contactor portion 120 in the first position 125. The first contactor element 110, the second contactor element 110, and the second contactor portion 120 can be electrically coupled with the second contactor portion 120 in the first position 125. The second contactor portion 120 can be thermally coupled with the heat sink 115 with the second contactor portion 120 in the second position 130. For example, the second contactor portion 120 can be positioned relative to the heat sink 115 such that the heat sink 115 can absorb heat from the second contactor portion 120 with the second contactor portion 120 in the second position 130.

Some of the description herein emphasizes the structural independence of the aspects of the system components or groupings of operations and responsibilities of these system components. Other groupings that execute similar overall operations are within the scope of the present application. Modules can be implemented in hardware or as computer instructions on a non-transient computer readable storage medium, and modules can be distributed across various hardware or computer based components.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

Example and non-limiting module implementation elements include sensors providing any value determined herein, sensors providing any value that is a precursor to a value determined herein, datalink or network hardware including communication chips, oscillating crystals, communication links, cables, twisted pair wiring, coaxial wiring, shielded wiring, transmitters, receivers, or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), or digital control elements.

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

For example, descriptions of positive and negative electrical characteristics may be reversed. Elements described as negative elements can instead be configured as positive elements and elements described as positive elements can instead by configured as negative elements. For example, elements described as having first polarity can instead have a second polarity, and elements described as having a second polarity can instead have a first polarity. Further relative parallel, perpendicular, vertical or other positioning or orientation descriptions include variations within +/−10% or +/−10 degrees of pure vertical, parallel or perpendicular positioning. References to "approximately," "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. An apparatus, comprising:
a housing;
a first contactor portion coupled with the housing;
a heat sink coupled with the housing; and
a second contactor portion that contacts the first contactor portion in a first position, and that thermally couples with the heat sink in a second position.

2. The apparatus of claim 1, comprising:
the first contactor portion and the second contactor portion configured to allow an electrical current to flow through the first contactor portion and the second contactor portion with the second contactor portion in the first position.

3. The apparatus of claim 1, comprising:
the heat sink configured to remove heat from the second contactor portion with the second contactor portion in the second position.

4. The apparatus of claim 1, comprising:
the heat sink coupled with a bottom of the housing to thermally couple with the second contactor portion with the second contactor portion in the second position, wherein the first contactor portion is coupled with a top of the housing.

5. The apparatus of claim 1, comprising:
a spring and a winding positioned within the housing, the winding to create an electromagnetic field to cause the second contactor portion to move from the second position to the first position, the spring to cause the second contactor portion to move from the first position to the second position in an absence of the electromagnetic field.

6. The apparatus of claim 1, comprising:
a spring and a winding positioned within the housing, the winding to create an electromagnetic field to cause the second contactor portion to move from the first position to the second position, the spring to cause the second contactor portion to move from the second position to the first position in an absence of the electromagnetic field.

7. The apparatus of claim 1, comprising:
a winding positioned within the housing, the winding to create an electromagnetic field to cause the second contactor portion to move from the second position to the first position; and
the heat sink to thermally couple with the winding.

8. The apparatus of claim 1, comprising:
a second heat sink coupled with the housing, the second heat sink to thermally couple with the second contactor portion with the second contactor portion in the second position, wherein the second heat sink comprises a different material than the heat sink.

9. The apparatus of claim 1, comprising:
a potting material thermally coupled with the heat sink, the potting material to remove heat from the heat sink.

10. The apparatus of claim 1, comprising:
the heat sink integrated into the housing to thermally couple with second contactor portion with the second contactor portion in the second position.

11. The apparatus of claim 1, comprising:
the heat sink detachably coupled with the housing to thermally couple with the second contactor portion with the second contactor portion in the second position.

12. The apparatus of claim 1, comprising:
the heat sink including a plurality of fins that extend away from the second contactor portion.

13. The apparatus of claim 1, comprising:
the heat sink includes a plurality of heat sink elements, wherein one or more of the plurality of heat sink elements contacts the second contactor portion in the second position.

14. A system, comprising:
a contactor, comprising:
a housing;
a first contactor portion coupled with the housing, the first contactor portion comprising a first contactor element and a second contactor element;
a heat sink coupled with the housing; and
a second contactor portion that contacts the first contactor portion in a first position, and that thermally couples with the heat sink in a second position;
a first busbar coupled with the first contactor element; and
a second busbar coupled with the second contactor element,
wherein the first busbar, the first contactor portion, the second contactor portion, and the second busbar are configured to receive an electrical current with the second contactor portion in the first position.

15. The system of claim 14, wherein the contactor is a first contactor, the system comprising:
a second contactor different than the first contactor, comprising:
a housing;
a first contactor portion;
a heat sink; and
a second contactor portion that contacts the first contactor portion in a first position and that thermally couples with the heat sink in a second position,
wherein the first busbar, the first contactor portion, the second contactor portion, and a third busbar are configured to receive an electrical current with the second contactor portion in the first position.

16. The system of claim 14, wherein the contactor is a first contactor, the system comprising:
a second contactor, comprising:
a housing;
a first contactor portion coupled with the housing;
a heat sink coupled with the housing; and
a second contactor portion positioned that contacts the first contactor portion in a first position and that thermally couples with the heat sink in a second position,
wherein the first busbar, the first contactor portion, the second contactor portion, and a third busbar are configured to receive an electrical current with the second contactor portion in the first position,
wherein the heat sink of the first contactor and the heat sink of the second contactor are thermally coupled.

17. The system of claim 14, comprising:
the first contactor portion and the second contactor portion to receive an electrical current with the second contactor portion in the first position.

18. The system of claim 14, comprising:
the heat sink to remove heat from the second contactor portion with the second contactor portion in the second position.

19. An electric vehicle, comprising:
a battery pack electrically coupled with at least one of a first busbar and a second busbar;
a contactor, comprising:
a housing;
a first contactor portion coupled with the housing, the first contactor portion comprising a first contactor element coupled with the first busbar and a second contactor element coupled with the second busbar;
a heat sink coupled with the housing; and
a second contactor portion that contacts the first contactor portion in a first position and that thermally couples with the heat sink in a second position.

20. The electric vehicle of claim 19, comprising:
the heat sink to remove heat from the second contactor portion.

* * * * *